(12) United States Patent
Nakajima

(10) Patent No.: US 8,199,041 B2
(45) Date of Patent: Jun. 12, 2012

(54) ANALOG-TO-DIGITAL CONVERTER

(75) Inventor: Yuji Nakajima, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 48 days.

(21) Appl. No.: 12/926,133

(22) Filed: Oct. 27, 2010

(65) Prior Publication Data

US 2011/0109488 A1    May 12, 2011

(30) Foreign Application Priority Data

Nov. 11, 2009   (JP) .................................. 2009-257948

(51) Int. Cl.
*H03M 1/12*   (2006.01)

(52) U.S. Cl. ........ 341/156; 341/118; 341/120; 341/155; 341/161

(58) Field of Classification Search .................. 341/120, 341/156, 161

See application file for complete search history.

(56) References Cited

U.S. PATENT DOCUMENTS

| | | | | |
|---|---|---|---|---|
| 4,733,217 A | * | 3/1988 | Dingwall | 341/122 |
| 4,908,621 A | * | 3/1990 | Polonio et al. | 341/120 |
| 5,353,027 A | * | 10/1994 | Vorenkamp et al. | 341/156 |
| 5,926,123 A | * | 7/1999 | Ostrom et al. | 341/120 |
| 6,999,019 B2 | * | 2/2006 | Cosand | 341/156 |
| 7,098,834 B2 | * | 8/2006 | Linder et al. | 341/155 |
| 7,142,138 B2 | | 11/2006 | Chen et al. | |

* cited by examiner

*Primary Examiner* — Khai M Nguyen

(74) *Attorney, Agent, or Firm* — McGinn IP Law Group, PLLC

(57) ABSTRACT

An analog-to-digital converter includes a higher-order analog-to-digital converter that outputs a higher-order digital value, a first lower-order converter that converts a first residual signal into a first lower-order digital value, a second lower-order converter that converts a second residual signal into a second lower-order digital value, a calibrator that outputs first and second offset adjustment signals for respectively designating offset adjustment amounts in reversed polarity based on a difference between the first and second lower-order digital values, wherein the first and second lower-order converters set a conversion calibration value based on the first and second offset adjustment signals and calibrate the first and second lower-order digital values based on the conversion calibration value.

17 Claims, 20 Drawing Sheets

FIRST STATE (PN1=0, PN2=0, PN3=0)

SECOND STATE (PN1=1, PN2=0, PN3=0)

THIRD STATE (PN1=0, PN2=0, PN3=1)

FIRST STATE(PN1=0, PN2=0)

US 8,199,041 B2

ANALOG-TO-DIGITAL CONVERTER

INCORPORATION BY REFERENCE

This application is based upon and claims the benefit of priority from Japanese patent application No. 2009-257948, filed on Nov. 11, 2009, the disclosure of which is incorporated herein in its entirety by reference.

BACKGROUND

1. Field of the Invention

The present invention relates to an analog-to-digital converter and, particularly, to an analog-to-digital converter that performs conversion by dividing a digital signal corresponding to an analog input signal into a higher-order bit signal and a lower-order bit signal.

2. Description of Related Art

A calibration technique of an analog-to-digital (AD) converter is broadly classified into a foreground calibration technique and a background calibration technique. In the foreground calibration technique, it is necessary to provide a calibration period in addition to a normal operation in order to perform calibration processing. However, the conversion accuracy of the AD converter varies depending on changes in operating environment such as a variation of a power supply voltage or a temperature of a semiconductor device. Therefore, in order to maintain the accuracy of the AD converter, the calibration period should be provided in a timely manner according to the operating environment. Specifically, in the foreground calibration technique, if the AD conversion processing continues without performing the calibration processing for a long time, it cannot keep up with such changes in the operating environment and fails to maintain the conversion accuracy.

On the other hand, in the background calibration technique, the calibration processing is performed in parallel with the normal operation. It is therefore not necessary to additionally provide the calibration period. Thus, it is possible to maintain the conversion accuracy even when the AD conversion processing is performed continuously. An example of the background calibration technique is disclosed in U.S. Pat. No. 7,142,138.

FIG. 27 is a block diagram of an AD converter 100 which is disclosed in U.S. Pat. No. 7,142,138. The AD converter 100 is a subranging AD converter using a calibration function. The subranging AD converter is also called a two-step AD converter or a serial-parallel AD converter. The subranging AD converter performs AD conversion on each of a higher-order bit and a lower-order bit of a digital value which is obtained as an output result.

The use of the subranging AD converter enables implementation of a converter having high resolution with a small number of circuit elements, and it is thereby possible to achieve reduction of costs and power consumption of the converter. For example, in the case of implementing a flash AD converter having 8-bit resolution, $2^8(256)$ comparators are required. On the other hand, in the case of implementing a subranging AD converter having 8-bit resolution with higher-order 4 bits and lower-order 4 bits, the converter can be implemented with $2^4(16)+2^4(16)=32$ comparators.

In the AD converter 100, a first analog signal is converted into a higher-order digital value by a sub-AD converter 110. Then, the higher-order digital value is converted into a second analog signal by a sub-digital-to-analog (DA) converter 112, so that a differential signal having a signal level of the first analog signal and the second analog signal is generated. The differential signal is amplified by an amplifier 114, and an amplified signal is supplied as a residual signal VOUT1 to a sub-AD converter 116. Then, the residual signal VOUT1 is converted into a lower-order digital value by the sub-AD converter 116. In the AD converter 100, the higher-order digital value and the lower-order digital value obtained in the above manner are combined and output as a final output value.

However, the subranging AD converter has a problem that, when the conversion accuracy of the DA converter (e.g. the sub-DA converter 112 in FIG. 27) is not high enough, the conversion accuracy of the converter as a whole is degraded. In light of this, in the AD converter 100, calibration is made for the sub-AD converter 116 and the amplifier 114. Specifically, in the sub-AD converter 116, an error which has occurred in the sub-DA converter 112 is calibrated by the amplifier 114 and the sub-AD converter 116 that generate the lower-order digital value. More specifically, in the AD converter 100, when the linearity of input/output characteristics of the sub-DA converter 112 is degraded, the gain of the amplifier 114 is controlled by a signal AV_CAL which is generated by a gain controller 115, and reference potentials VRP2_CAL and VRN2_CAL which are supplied to the sub-AD converter 116 are changed to thereby calibrate the output result of the sub-AD converter 116. The AD converter 100 thereby improves the conversion accuracy.

Further, in the AD converter 100, the calibration processing for the amplifier 114 and the sub-AD converter 116 is performed as background processing. The AD converter 100 can thereby perform the calibration of the conversion accuracy while performing the conversion processing.

SUMMARY

However, the AD converter 100 has the following problem. The AD converter 100 is based on the prerequisite that the first analog input signal is input to near the code transition point of the sub-AD converter 110 that outputs the higher-order digital value. FIG. 28 is a graph showing a relationship between the first analog input signal and the residual signal VOUT1. In the graph shown in FIG. 28, the horizontal axis indicates the first analog input signal, and the vertical axis indicates the signal level of the residual signal VOUT1. By the above prerequisite, highly accurate calibration is made in the AD converter 100 when the signal level of the first analog input signal is near the code transition points 1200 to 1229 of the sub-AD converter 110 shown in FIG. 28. Thus, when the first analog input signal is outside the range, calibration on the amplifier 114 and the sub-AD converter 116 is improperly made in the AD converter 100, which causes degradation of the conversion accuracy of the AD converter 100. The AD converter 100 thus has a problem that it cannot make calibration for the first analog input signal with an arbitrary signal level.

A first exemplary aspect of the present invention is an analog-to-digital converter which includes a higher-order analog-to-digital converter that outputs a higher-order digital value corresponding to a signal level of an analog input signal, a first lower-order converter that generates a first residual signal based on the higher-order digital value and the analog input signal and converts the first residual signal into a first lower-order digital value, a second lower-order converter that generates a second residual signal based on the higher-order digital value and the analog input signal and converts the second residual signal into a second lower-order digital value, and a calibrator that outputs a first offset adjustment signal and a second offset adjustment signal for respectively designating offset adjustment amounts in reversed polarity based on a difference between the first and second lower-order digital values, wherein the first lower-order converter and the second lower-order converter set a conversion calibration value based on the first and second offset adjustment signals and calibrate the first and second lower-order digital values based on the conversion calibration value.

In the analog-to-digital converter according to the exemplary aspect of the present invention, the calibrator outputs the first and second offset adjustment signals based on a difference between the first lower-order digital value output from the first lower-order converter and the second lower-order digital value output from the second lower-order converter. Then, the first and second lower-order converters calibrate the subsequent conversion result based on the first and second offset adjustment signals. Thus, the analog-to-digital converter according to the exemplary aspect of the present invention can always perform the calibration operation as background processing regardless of the signal level of the analog input signal.

The analog-to-digital converter according to the exemplary aspect of the present invention achieves improved conversion accuracy regardless of the signal level of the analog input signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

An exemplary embodiment of the present invention is described hereinafter with reference to the drawings. An AD converter 1 according to a first exemplary embodiment is a subranging AD converter having 5-bit resolution. Specifically, the AD converter 1 generates 3-bit higher-order digital value and 2-bit lower-order digital value for an analog input signal and combines the higher-order digital value and the lower-order digital value to obtain a final output value.

Figure 1:
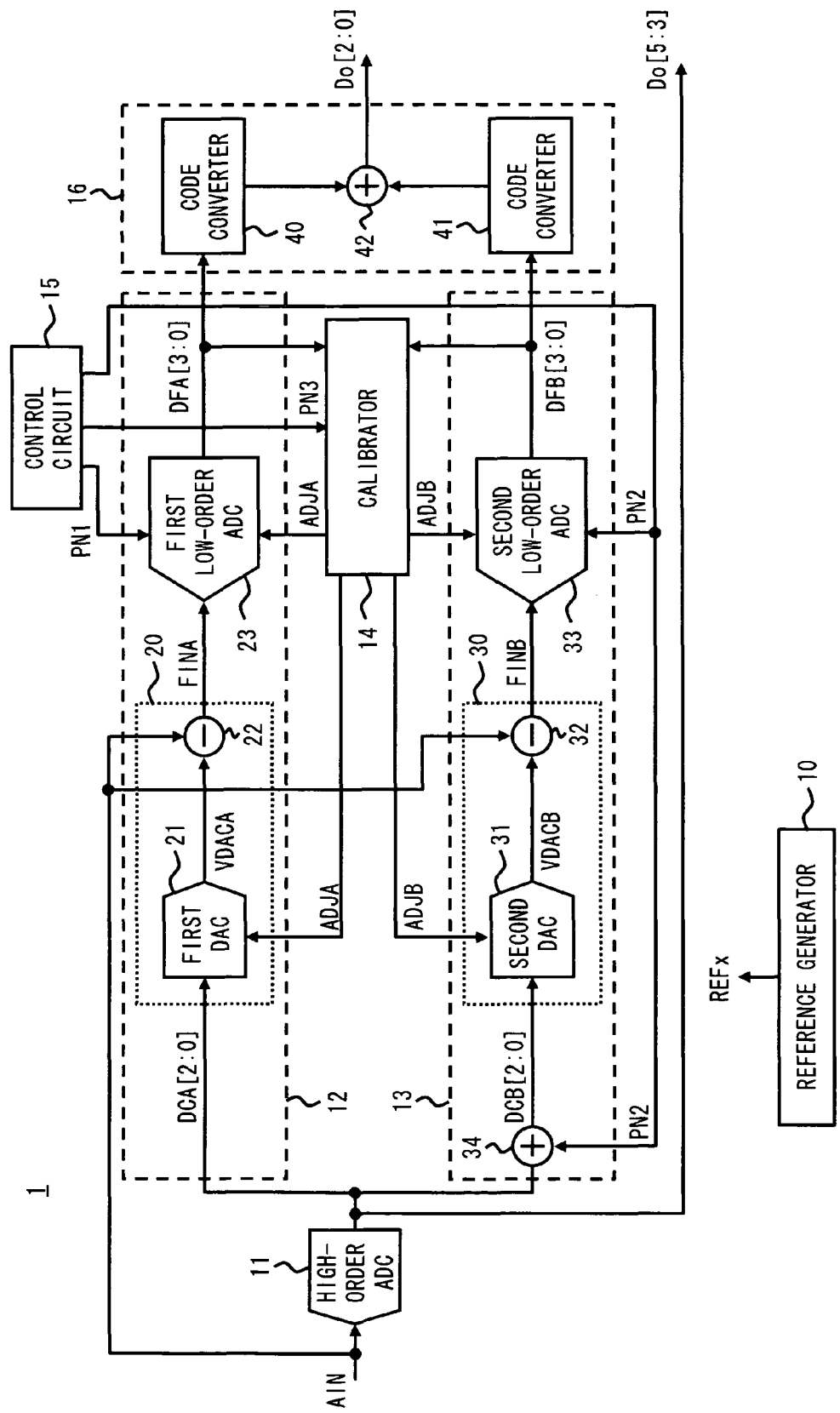
FIG. 1 is a block diagram of an AD converter according to a first exemplary embodiment.

FIG. 1 is a block diagram of the AD converter 1 according to the first exemplary embodiment. Referring to FIG. 1, the AD converter 1 according to the first exemplary embodiment includes a reference generator 10, a higher-order AD converter 11, a first lower-order converter 12, a second lower-order converter 13, a calibrator 14, a control circuit 15, and an encoder 16. Note that, as shown in FIG. 1, in the AD converter 1 which is described in the first exemplary embodiment, lower-order digital values which are output respectively from the first lower-order converter 12 and the second lower-order converter 13 are 4-bit thermometer codes. The encoder 16 then converts the 4-bit thermometer codes into 2-bit binary codes and adds up the 2-bit binary codes to thereby output a lower-order digital value as a 3-bit binary code. Then, an average value of the first and second lower-order digital values is calculated from the 3-bit value, and a 2-bit lower-order digital value (binary code) is obtained finally.

Figure 2:
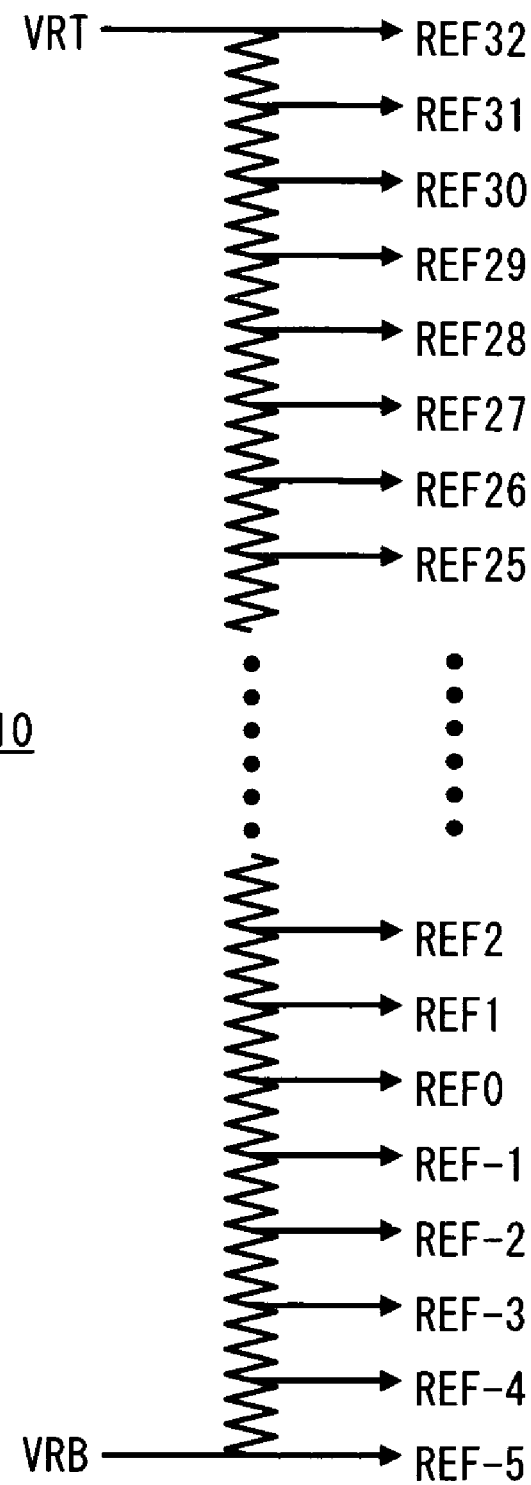
FIG. 2 is a circuit diagram of a reference circuit according to the first exemplary embodiment.

The reference generator 10 generates a plurality of reference voltages (which are indicated by REFx in FIG. 1) that are used in the higher-order AD converter 11, the first lower-order converter 12 and the second lower-order converter 13. Each voltage difference between the plurality of reference voltages REFx serves as a 1LSB voltage VLSB of the AD converter 1. FIG. 2 is a circuit diagram of the reference generator 10. Referring to FIG. 2, the reference generator 10 includes a plurality of resistors connected in series between a node supplied with a higher-order reference voltage VRT and a node supplied with a lower-order reference voltage VRB, and outputs voltages generated with the plurality of resistors as reference voltages REF-5 to REF32. The AD converter 1 has 5-bit resolution. Therefore, in this exemplary embodiment, the voltage range of the reference voltages REF0 to REF28 is the input voltage range of the analog input signal AIN which can be converted. Further, the reference voltages REF-5 to REF-1 are used in the calibration operation and supplied to the second lower-order converter 13.

The higher-order AD converter 11 outputs a higher-order digital value DCA which corresponds to the signal level of the analog input signal AIN. The higher-order digital value DCA is a binary code which represents the signal level of the analog input signal AIN with three bits. Specifically, when the higher-order digital value DCA indicates 0, the signal level of the analog input signal AIN is between the lower limit of the input voltage range and the signal level when the higher-order digital value DCA indicates 1. Further, when the higher-order digital value DCA indicates 7, the signal level of the analog input signal AIN has a value equal to or higher than the upper limit of the input voltage range.

Figure 3:
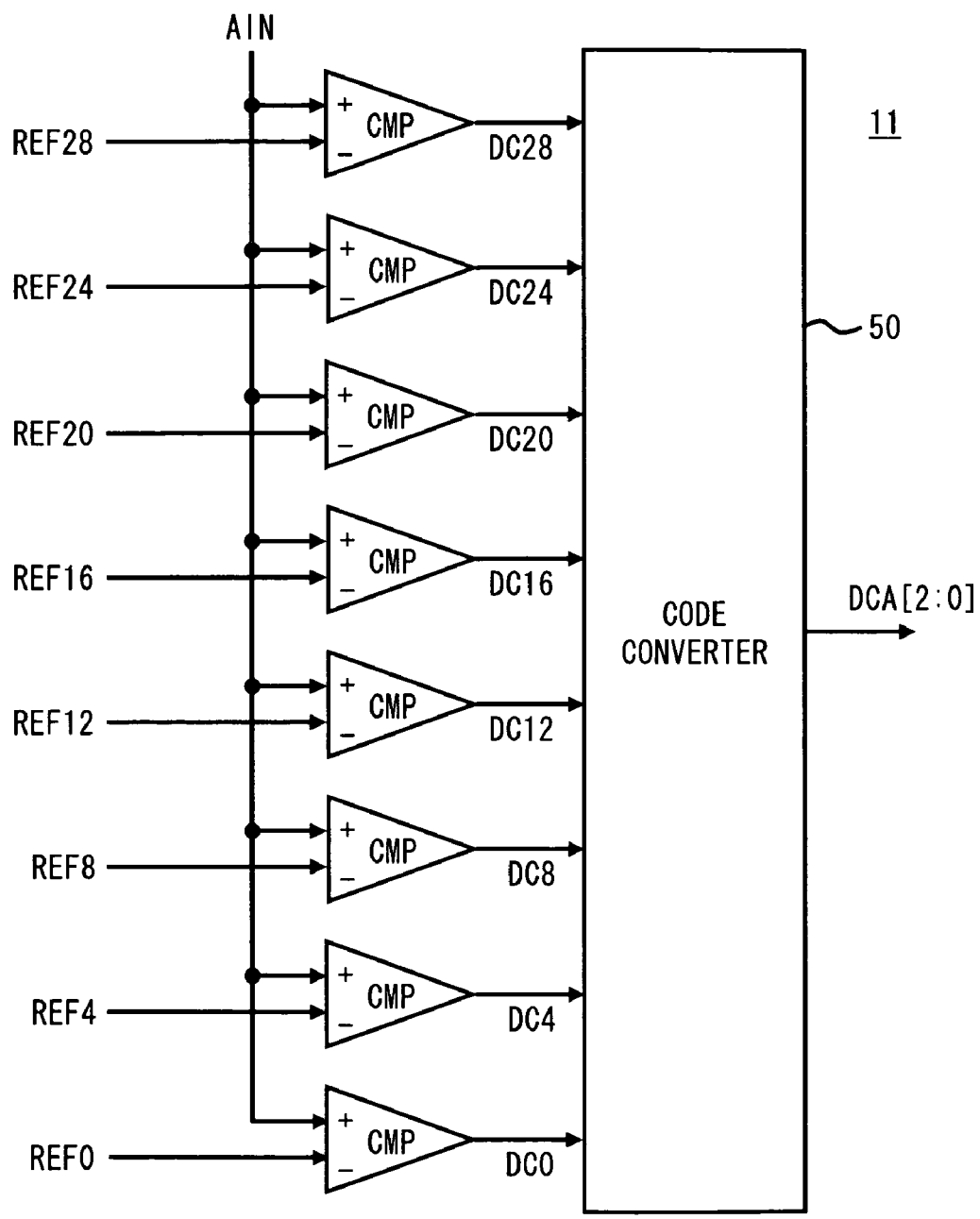
FIG. 3 is a block diagram of a higher-order AD converter according to the first exemplary embodiment.

FIG. 3 is a block diagram of the higher-order AD converter 11. Referring to FIG. 3, the higher-order AD converter 11 includes eight comparators CMP and a code converter 50. Reference voltages REF0, REF4, REF8, REF12, REF16, REF20, REF24 and REF28 are respectively supplied to the eight comparators CMP. In the AD converter 1 according to the exemplary embodiment, because the lower-order digital value is 2 bits, eight reference voltages whose voltage differences are 4LSB ($=4V_{LSB}$) of the lower-order digital value are supplied to the higher-order AD converter 11. Thus, the lower-order digital value is a value that makes interpolation between 1LSB ($=4V_{LSB}$) of the higher-order digital value. The comparators CMP compare the supplied reference voltage and the signal level of the analog input signal AIN and, if the signal level of the analog input signal AIN is higher than the supplied reference voltage, output High level. In the higher-order AD converter 11, thermometer codes having values of eight levels are output by the eight comparators CMP. In the example shown in FIG. 3, the thermometer codes are indicated by output signals DC0, DC4, DC8, DC12, DC16, DC20, DC24 and DC28 of the comparators CMP. The code converter 50 converts the thermometer codes having values of eight levels into a higher-order digital value DCA which is represented by 3-bit binary code.

The first lower-order converter 12 generates a first residual signal FINA based on the higher-order digital value DCA and the analog input signal AIN, and converts the first residual signal FINA into a first lower-order digital value DFA. The first lower-order converter 12 includes a first residual signal generator 20 and a first lower-order AD converter 23.

The first residual signal generator 20 outputs the first residual signal FINA based on the analog input signal AIN and the higher-order digital value DCA. Specifically, the first residual signal generator 20 includes a first DA converter 21 and a subtracter 22. The first DA converter 21 converts the higher-order digital value DCA into an analog value VDACA which corresponds to the value of the higher-order digital value DCA. The subtracter 22 outputs an analog value obtained by subtracting the analog value VDACA from the signal level of the analog input signal AIN as the first residual signal FINA.

Figure 4:
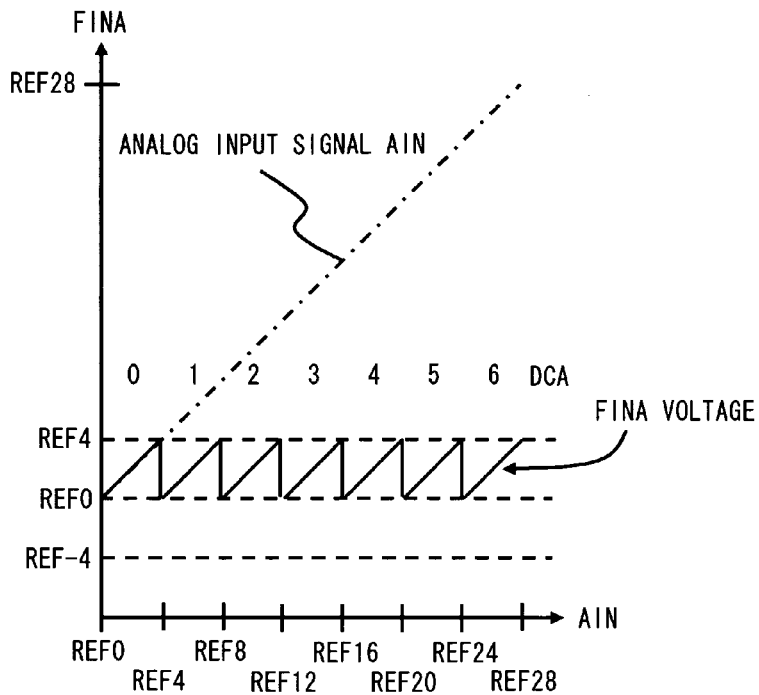
FIG. 4 is a graph showing a relationship between a first residual signal and a signal level of an analog input signal when there is no error in a first lower-order converter according to the first exemplary embodiment.

A relationship between the first residual signal FINA and the analog input signal AIN is described hereinafter. FIG. 4 is a graph showing a relationship between the first residual signal FINA and the analog input signal AIN in the case where there is no conversion error in the first residual signal generator 20. In the example of FIG. 4, the analog input signal AIN has the voltage range of the reference voltages REF0 to REF28. At this time, the higher-order digital value DCA has values 0 to 6. Therefore, the first DA converter 21 outputs the analog values VDACA which correspond to REF0, REF4, REF8, REF12, REF16, REF20 and REF24 according to the value of the higher-order digital value DCA. Then, the first residual signal generator 20 outputs a difference between the signal level of the analog input signal AIN and the analog value VDACA as the first residual signal FINA. Thus, the first residual signal FINA has values of the reference voltages REF0 to REF4. Further, the signal level of the first residual signal FINA switches to the reference voltage REF0 each time the value of the higher-order digital value DCA switches.

The first lower-order AD converter 23 converts the first residual signal FINA into a first lower-order digital value DFA and outputs it. In this exemplary embodiment, a flash AD converter is used as the first lower-order AD converter 23. Further, it is assumed that the first lower-order digital value DFA which is output from the first lower-order AD converter 23 is a thermometer code having a value based on the signal level of the first residual signal FINA. The thermometer code has four values which can be represented by 2-bit binary codes, and it is thus a 4-bit signal.

The second lower-order converter 13 generates a second residual signal FINB based on the higher-order digital value DCA and the analog input signal AIN, and converts the second residual signal FINB into a second lower-order digital value DFB. Further, the second lower-order converter 13 generates the second residual signal FINB according to the higher-order digital value DCA during a first period, and generates the second residual signal FINB according to the higher-order digital value DCA which is shifted at least by 1LSB (a higher-order digital value DCB in FIG. 1) during a second period. The second lower-order converter 13 includes a level shifter 34, a second residual signal generator 30, and a second lower-order AD converter 33.

The level shifter 34 outputs the higher-order digital value DCA as the higher-order digital value DCB during the first period, and outputs the higher-order digital value DCA which is shifted at least by 1LSB as the higher-order digital value DCB during the second period. The first period and the second period are switched according to the value of a control signal PN2 which is output from the control circuit 15. For example, the value of the control signal PN2 is 0 in the first period, and the value of the control signal PN2 is 1 in the second period. In this exemplary embodiment, an adder is used as the level shifter 34. Thus, the level shifter 34 adds the value of the control signal PN2 to the higher-order digital value DCA and outputs the higher-order digital value DCB.

The second residual signal generator 30 outputs the second residual signal FINB based on the analog input signal AIN and the higher-order digital value DCB. Specifically, the second residual signal generator 30 includes a second DA converter 31 and a subtracter 32. The second DA converter 31 converts the higher-order digital value DCB into an analog value VDACB which corresponds to the value of the higher-order digital value DCB. The subtracter 32 outputs an analog value obtained by subtracting the analog value VDACB from the signal level of the analog input signal AIN as the second residual signal FINB.

Figure 5:
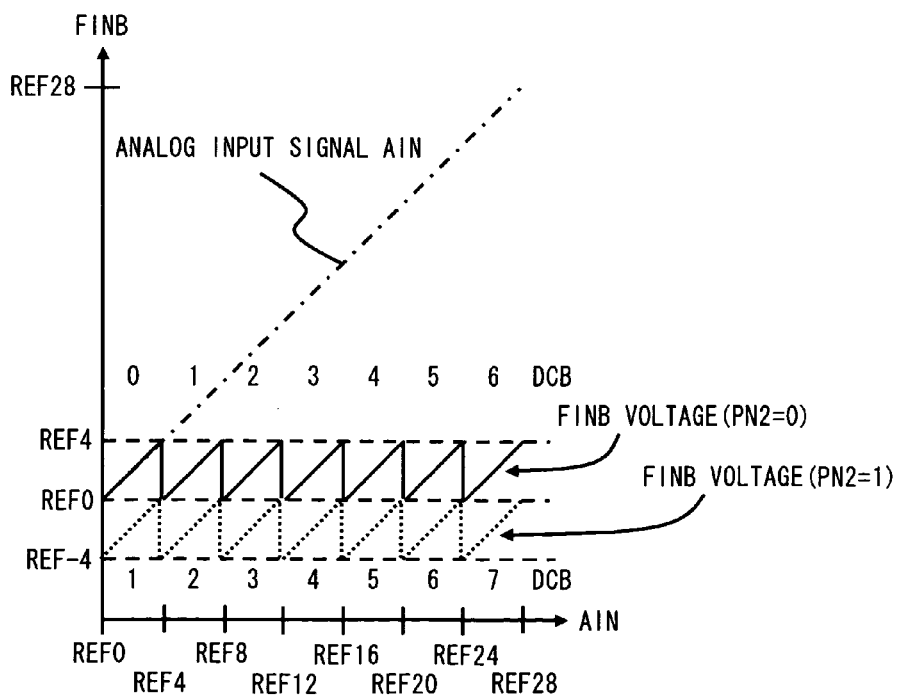
FIG. 5 is a graph showing a relationship between a second residual signal and a signal level of an analog input signal when there is no error in a second lower-order converter according to the first exemplary embodiment.

A relationship between the second residual signal FINB and the analog input signal AIN is described hereinafter. FIG. 5 is a graph showing a relationship between the second residual signal FINB and the analog input signal AIN in the case where there is no conversion error in the second residual signal generator 30. In the example of FIG. 5, the analog input signal AIN has the voltage range of the reference voltages REF0 to REF28. On the other hand, in the second lower-order converter 13, the value of the higher-order digital value DCB varies depending on the value of the control signal PN2. Specifically, when the higher-order digital value DCB has values 0 to 6 when the control signal PN2 is 0, and the higher-order digital value DCB has values 1 to 7 when the control signal PN2 is 1.

Therefore, during the period when the control signal PN2 is 0, the second DA converter 31 outputs the analog values VDACB which correspond to REF0, REF4, REF8, REF12, REF16, REF20 and REF24 according to the value of the higher-order digital value DCB. Then, the second residual signal generator 30 outputs a difference between the signal level of the analog input signal AIN and the analog value VDACB as the second residual signal FINB. Thus, during the period when the control signal PN2 is 0, the second residual signal FINB has values of the reference voltages REF0 to REF4. Further, the signal level of the second residual signal FINB switches to the reference voltage REF0 each time the value of the higher-order digital value DCB switches.

On the other hand, during the period when the control signal PN2 is 1, the second DA converter 31 outputs the analog values VDACB which correspond to REF4, REF8, REF12, REF16, REF20, REF24 and REF28 according to the value of the higher-order digital value DCB. Then, the second residual signal generator 30 outputs a difference between the signal level of the analog input signal AIN and the analog value VDACB as the second residual signal FINB. Thus, during the period when the control signal PN2 is 1, the second residual signal FINB has values of the reference voltages REF-4 to REF0. Further, the signal level of the second residual signal FINB switches to the reference voltage REF-4 each time the value of the higher-order digital value DCB switches.

The second lower-order AD converter 33 converts the second residual signal FINB into a second lower-order digital value DFB and outputs it. In this exemplary embodiment, a flash AD converter is used as the second lower-order AD converter 33. Further, it is assumed that the second lower-order digital value DFB which is output from the second lower-order AD converter 33 is a thermometer code having a value based on the signal level of the second residual signal FINB. The thermometer code has four values which can be represented by 2-bit binary codes, and it is thus a 4-bit binary.

The calibrator 14 outputs a first offset adjustment signal ADJA and a second offset adjustment signal ADJB for respectively designating offset adjustment amounts in reversed polarity to each other based on the difference between the first lower-order digital value DFA and the second lower-order digital value DFB. The first offset adjustment signal ADJA is supplied to the first lower-order converter 12, and the second offset adjustment signal ADJB is supplied to the second lower-order converter 13. In the first exemplary embodiment, the first offset adjustment signal ADJA is supplied to the first DA converter 21 and the first lower-order AD converter 23 of the first lower-order converter 12. Then, in the first lower-order converter 12, the first DA converter 21 and the first lower-order AD converter 23 perform calibration of a conversion result of the first residual signal FINA by using a conversion calibration value which is set based on the first offset adjustment signal ADJA. Further, the second offset adjustment signal ADJB is supplied to the second DA converter 31 and the second lower-order AD converter 33 of the second lower-order converter 13. Then, in the second lower-order converter 13, the second DA converter 31 and the second lower-order AD converter 33 perform calibration of a conversion result of the second residual signal FINB by using a conversion calibration value which is set based on the second offset adjustment signal ADJB.

The control circuit 15 outputs a first control signal PN1, a second control signal PN2, and a third control signal PN3. The first control signal PN1, the second control signal PN2, and the third control signal PN3 are pseudo-random numbers, for example. The first control signal PN1 is supplied to the first lower-order AD converter 23 of the first lower-order converter 12. The first control signal PN1 is used for offset calibration of the comparators of the first lower-order AD converter 23 and the second lower-order AD converter 33. The second control signal PN2 is supplied to the second lower-order AD converter 33 and the level shifter 34 of the second lower-order converter 13. The second control signal PN2 is used for offset calibration of the first DA converter 21 and the second DA converter 31. The third control signal PN3 is supplied to the calibrator 14. The third control signal PN3 controls to which of the lower-order AD converter and the DA converter the first offset adjustment signal ADJA and the second offset adjustment signal ADJB are supplied.

The encoder 16 converts the first lower-order digital value DFA and the second lower-order digital value DFB into binary codes and outputs the sum of the converted binary codes as a lower-order digital value Do[2:0]. The lower-order digital value Do is a 3-bit binary code, and an average value of the first and second lower-order digital values which is obtained by processing the binary code is a final lower-order digital value. Note that a calculation unit that calculates the average value of the first and second lower-order digital values from the lower-order digital value Do is not shown in FIG. 1.

The first residual signal generator 20, the second residual signal generator 30, the first lower-order AD converter 23, the second lower-order AD converter 33 and the calibrator 14, which are described above, are described in further detail hereinbelow. First, the first residual signal generator 20 and the second residual signal generator 30 are described. The first residual signal generator 20 and the second residual signal generator 30 are substantially the same circuits, and the first residual signal generator 20 is described hereinafter.

Figure 6:
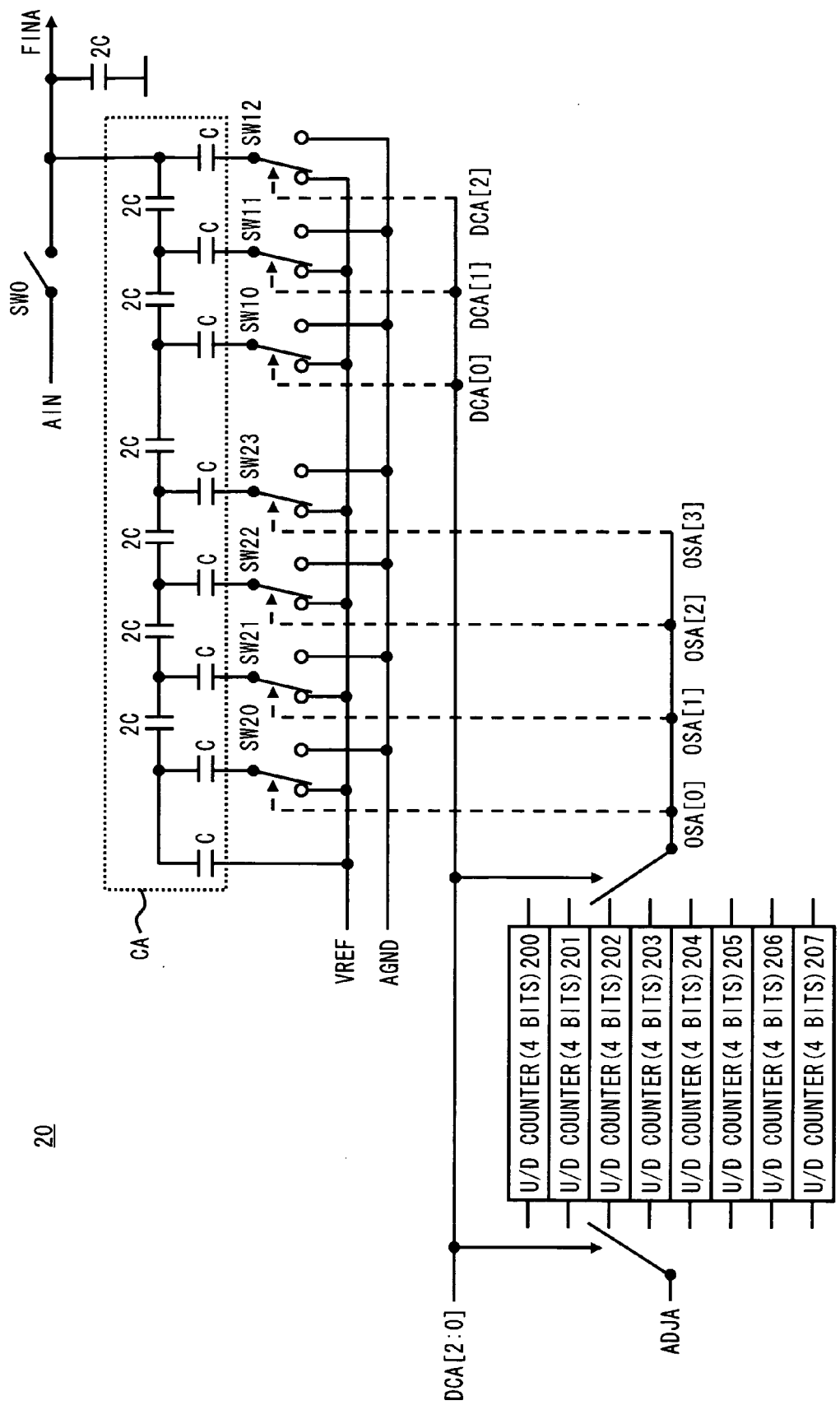
FIG. 6 is a circuit diagram of a residual signal generator according to the first exemplary embodiment.

FIG. 6 is a block diagram of the first residual signal generator 20. Referring to FIG. 6, the first residual signal generator 20 is an AD converter that has a capacitor array CA, and the function of the subtracter 22 shown in FIG. 1 is implemented by the operation of the AD converter. Further, the first residual signal generator 20 includes up/down counters 200 to 207 as a calibration value holding unit that holds calibration values.

In the capacitor array CA of the DA converter, capacitors having a capacitance value C (which are referred to hereinafter as capacitors C) and capacitors having a capacitance value 2C (which is double the value C) (which are referred to hereinafter as capacitors 2C) are connected in a ladder configuration. Then, a reference voltage VREF (in this exemplary embodiment, VREF is set to $64V_{LSB}$) is supplied to one terminal of the capacitor C which is connected at one end of the capacitor ladder. Further, either one of the reference voltage VREF or a ground voltage AGND is supplied through a switch to one end of the other capacitors C. In this exemplary embodiment, set calibration values are held by the up/down counters 200 to 207, which are configured by 4 bits in this exemplary embodiment. Further, the higher-order digital value DCA is 3 bits. Thus, switches SW20 to SW23 are used as switches that perform a switching operation based on a conversion calibration value OSA, and switches SW10 to SW12 are used as switches that perform a switching operation based on the higher-order digital value DCA.

Further, the analog input signal AIN is input through a switch SW0 to a node corresponding to the most significant bit of the higher-order digital value DCA among the nodes of the capacitor array CA. Further, a capacitor having a capacitance value 2C is connected between the node corresponding to the most significant bit of the higher-order digital value DCA among the nodes of the capacitor array CA and a ground terminal. Then, the first residual signal generator 20 outputs the first residual signal FINA from the node corresponding to the most significant bit of the higher-order digital value DCA among the nodes of the capacitor array CA.

Further, in this exemplary embodiment, because the higher-order digital value DCA is made up of 3 bits, the number of up/down counters is eight, which corresponds to the number of values which the higher-order digital value DCA can have. The up/down counters 200 to 207 respectively correspond to any value of the higher-order digital value DCA. In this exemplary embodiment, a switch for selecting any of the up/down counters 200 to 207 according to the value of the higher-order digital value DCA is provided. Then, the first offset adjustment signal ADJA is input to the up/down counter selected by the switch. Further, the up/down counter selected by the switch outputs the conversion calibration value OSA to the switches SW20 to SW23.

Figure 7:
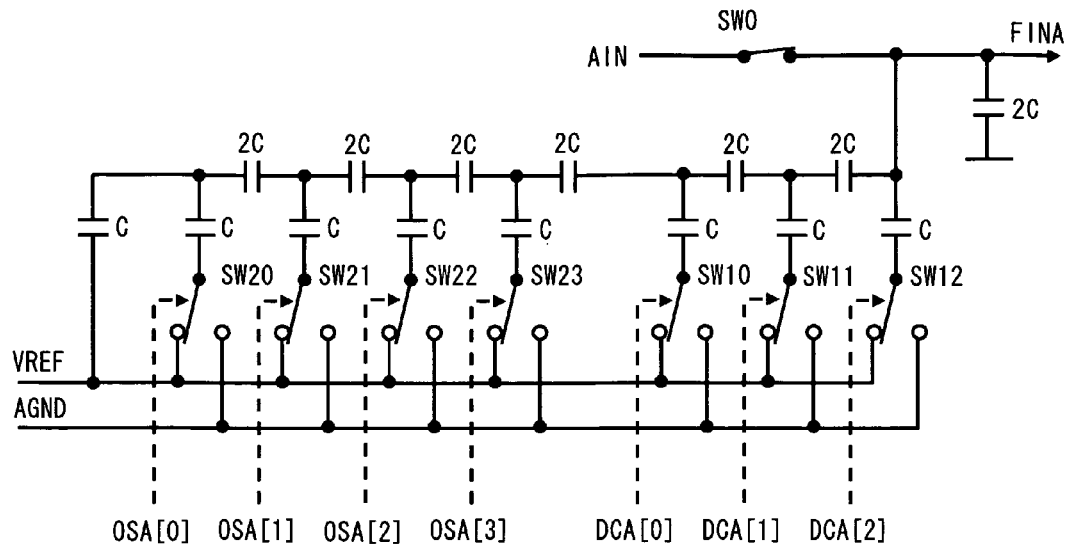
FIG. 7 is a circuit diagram showing a connection state in a first operation period of the residual signal generator according to the first exemplary embodiment.

The operation of the first residual signal generator 20 is described hereinbelow. The first residual signal generator 20 generates the first residual signal through three operation periods. First, FIG. 7 shows a connection state of the first residual signal generator 20 in a first operation period. As shown in FIG. 7, in the first operation period, the switch SW0 is short-circuited, and the switches SW10 to SW12 and the switches SW20 to SW23 select the reference voltage VREF. At this time, it is assumed that the conversion calibration value OSA and the higher-order digital value DCA are all 0. Therefore, in the first operation period, charges corresponding to the signal level of the analog input signal AIN are accumulated in the capacitor 2C that is connected to an output terminal.

Figure 8:
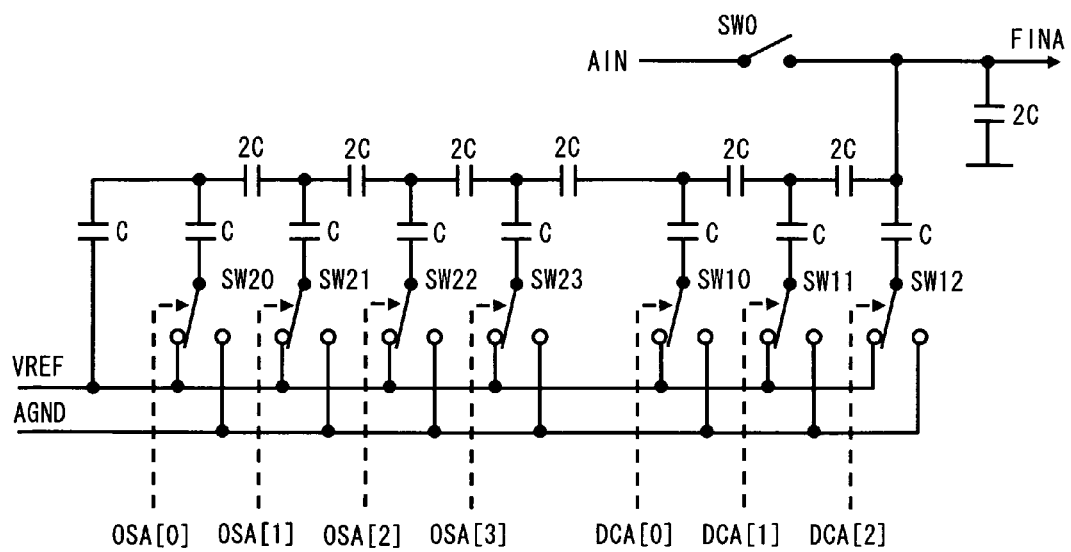
FIG. 8 is a circuit diagram showing a connection state in a second operation period of the residual signal generator according to the first exemplary embodiment.

FIG. 8 shows a connection state of the first residual signal generator 20 in a second operation period. As shown in FIG. 8, in the second operation period, the switch SW0 is opened, and sampling of the signal level of the analog input signal AIN is completed. Then, the first residual signal generator 20 makes transition to the third operation period.

Figure 9:
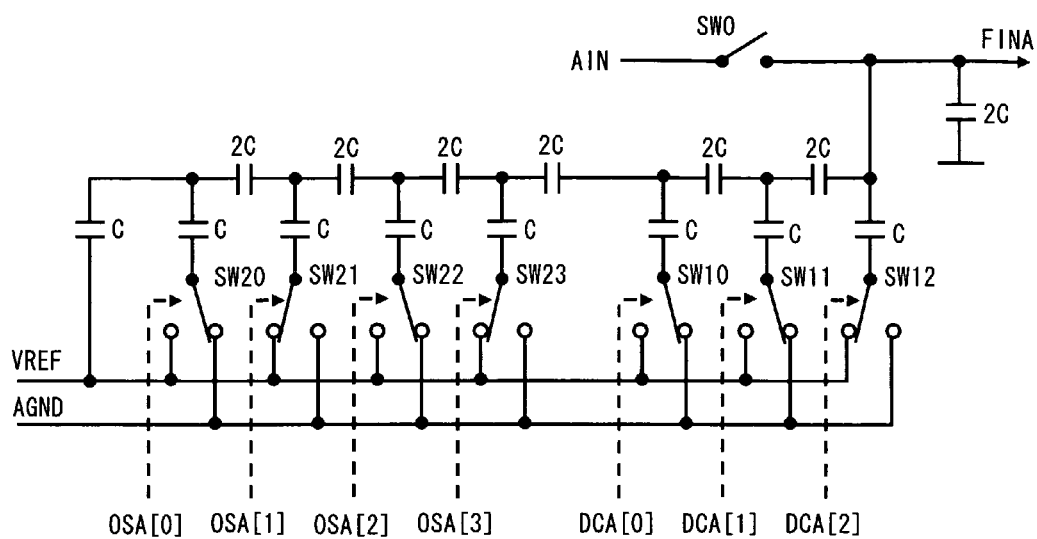
FIG. 9 is a circuit diagram showing a connection state in a third operation period of the residual signal generator according to the first exemplary embodiment.

FIG. 9 shows a connection state of the first residual signal generator 20 in a third operation period. As shown in FIG. 9, the switch whose corresponding higher-order digital value DCA has a bit value of 1 among the switches SW10 to SW12 selects the ground voltage AGND, and the other switches select the reference voltage VREF. Further, the switch whose corresponding conversion calibration value OSA has a bit value of 1 among the switches SW20 to SW23 selects the ground voltage AGND, and the other switches select the reference voltage VREF.

Hereinafter, the signal level of the first residual signal FINA which is output in the third operation period is described. First, the signal level of the first residual signal FINA is represented by the following expression (1):

$$FINA = AIN - \frac{VREF}{256}\left(\begin{array}{l}64DCA[2] + 32DCA[1] + 16DCA[0] + \\ 8OSA[3] + 4OSA[2] + 2OSA[1] + OSA[0]\end{array}\right) \quad (1)$$

Further, if the higher-order digital value DCA and the conversion calibration value OSA in the above expression (1) are represented in decimal numeration, the following expression (2) is obtained:

$$FINA = AIN - \frac{VREF}{16}DCA - \frac{VREF}{256}OSA \quad (2)$$

Because VREF=$64V_{LSB}$ in this exemplary embodiment, if VREF is set to $64V_{LSB}$, the expression (2) can be represented by the following expression (3):

$$FINA = AIN - 4V_{LSB}DCA - \frac{V_{LSB}}{4}OSA \quad (3)$$

Referring to the expression (3), the first residual signal FINA is adjusted in units of $4V_{LSB}$ by the value of the higher-order digital value DCA, and it is further calibrated in units of $V_{LSB}/4$ by the conversion calibration value OSA.

Figure 10:
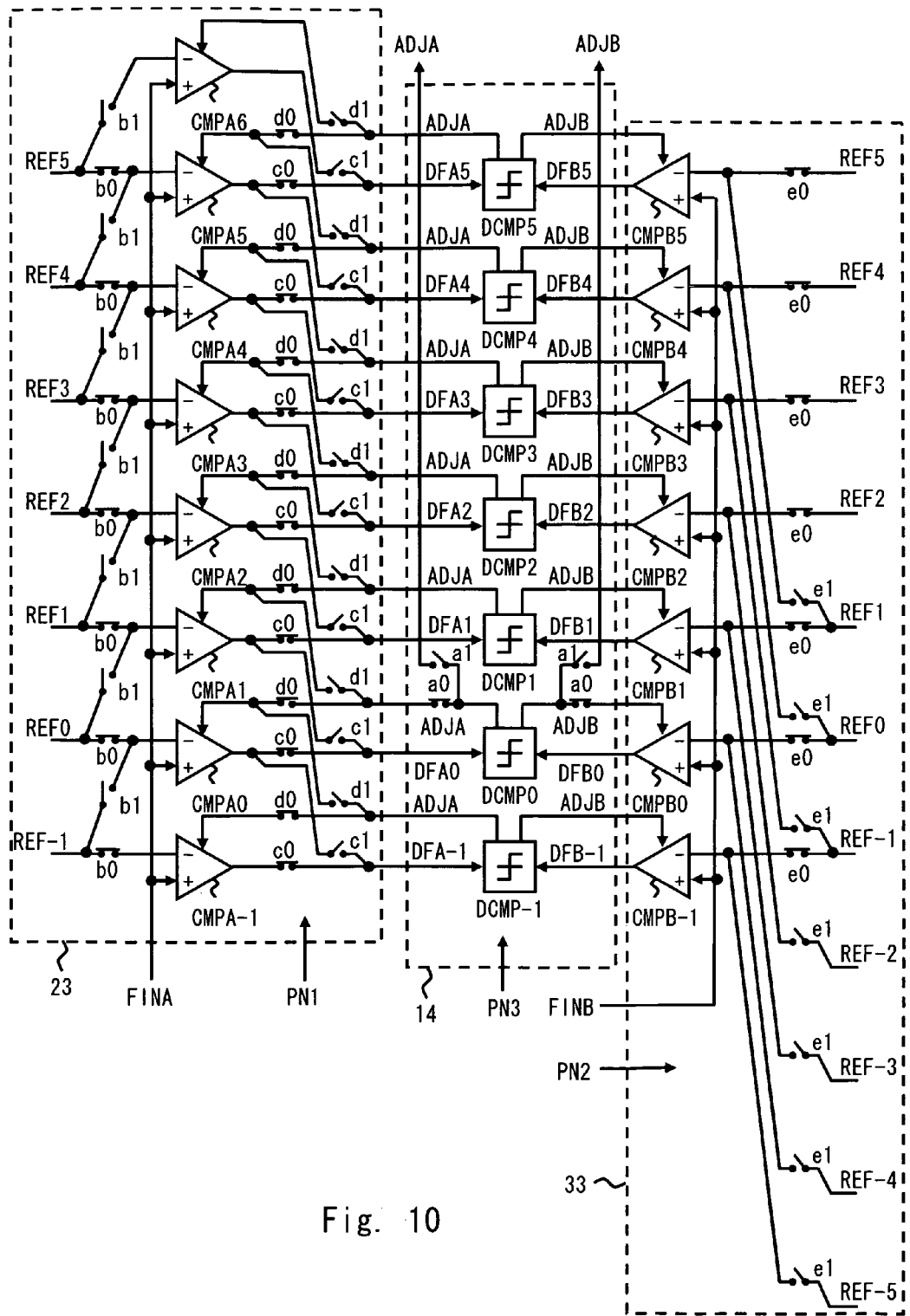
FIG. 10 is a circuit diagram of a lower-order AD converter according to the first exemplary embodiment.

Next, the first lower-order AD converter 23, the second lower-order AD converter 33 and the calibrator 14 are described in detail. FIG. 10 is a block diagram of the first lower-order AD converter 23, the second lower-order AD converter 33 and the calibrator 14.

Referring to FIG. 10, the calibrator 14 includes a plurality of match/mismatch determination circuits (e.g. digital comparators DCMP-1 to DCMP5) and a calibration target selector. The digital comparators DCMP-1 to DCMP5 compare the bit values of the first lower-order digital value DFA and the second lower-order digital value DFB and, if the two bit values match, outputs the first offset adjustment signal ADJA and the second offset adjustment signal ADJB which instruct to maintain the conversion calibration value. On the other hand, the digital comparators DCMP-1 to DCMP5 compare the bit values of the first lower-order digital value DFA and the second lower-order digital value DFB and, if the two bit values mismatch, outputs the offset adjustment signal which instructs to reduce the conversion calibration value to the lower-order converter that has output the High-level bit value, and outputs the offset adjustment signal which instructs to increase the conversion calibration value to the lower-order converter that has output the Low-level bit value.

The calibration target selector is placed corresponding to the digital comparator DCMP0. The calibration target selector is composed of switches a0 and a1. The switch a0 is placed in a path for transmitting the first offset adjustment signal ADJA to the first lower-order AD converter 23 and a path for transmitting the second offset adjustment signal ADJB to the second lower-order AD converter 33. Further, the switch a1 is placed in a path for transmitting the first offset adjustment signal ADJA to the first residual signal generator 20 and a path for transmitting the second offset adjustment signal ADJB to the second residual signal generator 30. The switch a0 is short-circuited when the third control signal PN3 is 0, and the switch a1 is short-circuited when the third control signal PN3 is 1. Thus, the calibration target selector supplies the first and second offset adjustment signals to any one of the first and second lower-order AD converters and the first and second residual signal generators.

Although, the calibration target selector is placed for the digital comparator DCMP0 in the example of FIG. 10, the calibration target selector may be placed for any one of the plurality of digital comparators DCMP. For example, in the case where the calibration target selector is placed only for the digital comparator DCMP0, the calibration of the residual signal generator is made when the signal level of the residual signal is near REF0. On the other hand, if the calibration target selector is placed for all of the plurality of digital comparators DCMP, the calibration of the residual signal generator can be made when the signal level of the residual signal is any value. Thus, in the calibrator 14, it is possible to set at which signal level of the residual signal the calibration of the residual signal generator is made depending on for which digital comparator the calibration target selector is placed.

The first lower-order AD converter 23 includes a plurality of comparators (e.g. comparators CMPA-1 to CMPA6), a first barrel shifter, a second barrel shifter, and a third barrel shifter. The comparators CMPA-1 to CMPA6 respectively correspond to the −1st bit to 6th bit values of the first lower-order digital value. Note that, the 0th to 3rd bit values are used as the first lower-order digital value DFA to be supplied to the encoder 16.

Figure 11:
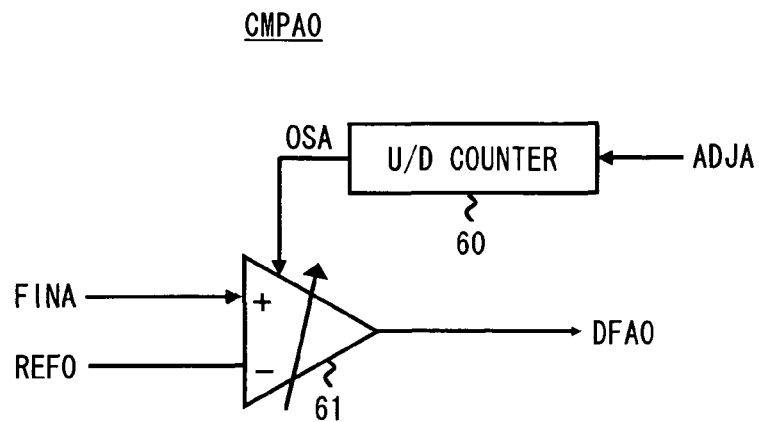
FIG. 11 is a block diagram of a comparator of the lower-order AD converter according to the first exemplary embodiment.

The plurality of comparators compare the input reference voltage and the signal level of the first residual signal FINA and, if the signal level of the first residual signal FINA is lower than the reference voltage, output Low level and, if the signal level of the first residual signal FINA is higher than the reference voltage, output High level. Further, the plurality of comparators include a calibration value holding unit that holds a conversion calibration value, increases and decreases the conversion calibration value based on the first offset adjustment signal ADJA, and calibrates the input offset voltage based on the conversion calibration value. A block diagram of the comparators is described hereinafter. Because the comparators used in the lower-order AD converter have the same configuration, the comparator CMPA0 is described as an example. FIG. 11 is a block diagram of the comparator CMPA0. Note that the comparator shown in FIG. 11 is used also as the comparator of the second lower-order AD converter 33.

Referring to FIG. 11, the comparator CMPA0 includes a calibration value holding unit 60 and a comparator 61. The calibration value holding unit 60 is an up/down counter. The up/down counter increases and decreases the held conversion calibration value OSA based on the value of the first offset adjustment signal ADJA. The comparator 61 changes the input offset voltage based on the conversion calibration value OSA. Then, the comparator 61 performs comparison based on the input offset voltage which has been changed based on the held conversion calibration value OSA.

The first barrel shifter is composed of switches b0 and b1. The first barrel shifter supplies either one of the first reference voltage or the second reference voltage to the first comparator included in the plurality of comparators. Specifically, when the first control signal PN1 is 0, the switch b0 is short-circuited. Then, the first reference voltage is supplied to the comparators CMPA-1 to CMPA5. For example, the reference voltages REF-1 to REF5 corresponding to the −1st to 5th bits of the first lower-order digital value are supplied to the comparators CMPA-1 to CMPA5 corresponding to the −1st to 5th bits of the first lower-order digital value. On the other hand, when the first control signal PN1 is 1, the switch b1 is short-circuited. Then, the second reference voltage is supplied to the comparators CMPA0 to CMPA6. For example, the reference voltages REF-1 to REF5 corresponding to the −1st to 5th bits of the first lower-order digital value are supplied to the comparators CMPA0 to CMPA6 corresponding to the 0th to 6th bits of the first lower-order digital value. Specifically, the first reference voltage is a reference voltage to which the same number as the last number of the reference symbol of the comparator is affixed, and the second reference voltage is a reference voltage to which the number obtained by subtracting 1 from the last number of the reference symbol of the comparator is affixed.

The second barrel shifter is composed of switches c0 and c1. The second barrel shifter switches between outputting the output of the first comparator as the bit value of the first lower-order digital value corresponding to the first reference voltage and outputting it as the bit value of the first lower-order digital value corresponding to the second reference voltage. Specifically, when the first control signal PN1 is 0, the switch c0 is short-circuited. Then, the outputs of the comparators CMPA-1 to CMPA5 are output as the −1st to 5th bit information of the lower-order digital signal corresponding to the reference voltages REF-1 to REF5. On the other hand, when the first control signal PN1 is 1, the switch c1 is short-circuited. Then, the outputs of the comparators CMPA0 to CMPA6 are output as the −1st to 5th bit information of the lower-order digital signal corresponding to the reference voltages REF-1 to REF5.

The third barrel shifter is composed of switches d0 and d1. The third barrel shifter supplies either one of the first offset adjustment signal corresponding to the first reference voltage or the first offset adjustment signal corresponding to the second reference voltage to the first comparator. Specifically, when the first control signal PN1 is 0, the switch d0 is short-circuited. Then, the first offset adjustment signal ADJA output from the digital comparators DCMP-1 to DCMP5 is supplied to the comparators CMPA-1 to CMPA5. On the other hand, when the first control signal PN1 is 1, the switch d1 is short-circuited. Then, the first offset adjustment signal ADJA output from the digital comparators DCMP-1 to DCMP5 is supplied to the comparators CMPA0 to CMPA6.

The second lower-order AD converter 33 includes a plurality of comparators (e.g. the comparators CMPB-1 to CMPB5) and a fourth barrel shifter. The comparators CMPB-1 to CMPB5 respectively correspond to the −1st to 5th bit values of the second lower-order digital value. Note that, the 0th to 3rd bit values are used as the second lower-order digital value DFB to be supplied to the encoder 16.

The plurality of comparators compare the input reference voltage and the signal level of the second residual signal FINB and, if the signal level of the second residual signal FINB is lower than the reference voltage, output Low level and, if the signal level of the second residual signal FINB is higher than the reference voltage, output High level. Further, the plurality of comparators include a calibration value holding unit that holds a conversion calibration value, increases and decreases the conversion calibration value based on the first offset adjustment signal ADJA, and calibrates the input offset voltage based on the conversion calibration value. The comparators CMPB-1 to CMPB5 have substantially the same configuration as the comparator CMPA0 which is described earlier with reference to FIG. 11.

The fourth barrel shifter is composed of switches e0 and e1. The fourth barrel shifter supplies either one of the first reference voltage or the third reference voltage to the second comparator included in the plurality of comparators. Specifically, when the second control signal PN2 is 0, the switch e0 is short-circuited. Then, the first reference voltage is supplied to the comparators CMPB-1 to CMPB5. For example, the reference voltages REF-1 to REF5 corresponding to the −1st to 5th bits of the second lower-order digital value are supplied to the comparators CMPB-1 to CMPB5 corresponding to the −1st to 5th bits of the second lower-order digital value. On the other hand, when the second control signal PN2 is 1, the switch e1 is short-circuited. Then, the third reference voltage is supplied to the comparators CMPB-1 to CMPB5. For example, the reference voltages REF-5 to REF1 corresponding to the −5th to 1st bits of the second lower-order digital value are supplied to the comparators CMPB-1 to CMPB5 corresponding to the −1st to 5th bits of the second lower-order digital value. Because 1LSB of the higher-order digital value is $4V_{LSB}$, the first reference voltage and the third reference voltage have a relationship which is shifted from each other by $4V_{LSB}$. Specifically, the third reference voltage is a reference voltage to which the same number as the last number of the reference symbol of the comparator is affixed, and the third reference voltage is a reference voltage to which the number obtained by subtracting 4 from the last number of the reference symbol of the comparator is affixed.

The operation of the AD converter 1 according to the first exemplary embodiment is described hereinafter. In the following description, the operation when different levels of offset variations are occurring in the first residual signal generator 20 and the second residual signal generator 30 is described. First, the first residual signal FINA and the second residual signal FINB in an exemplary operation are described.

Figure 12:
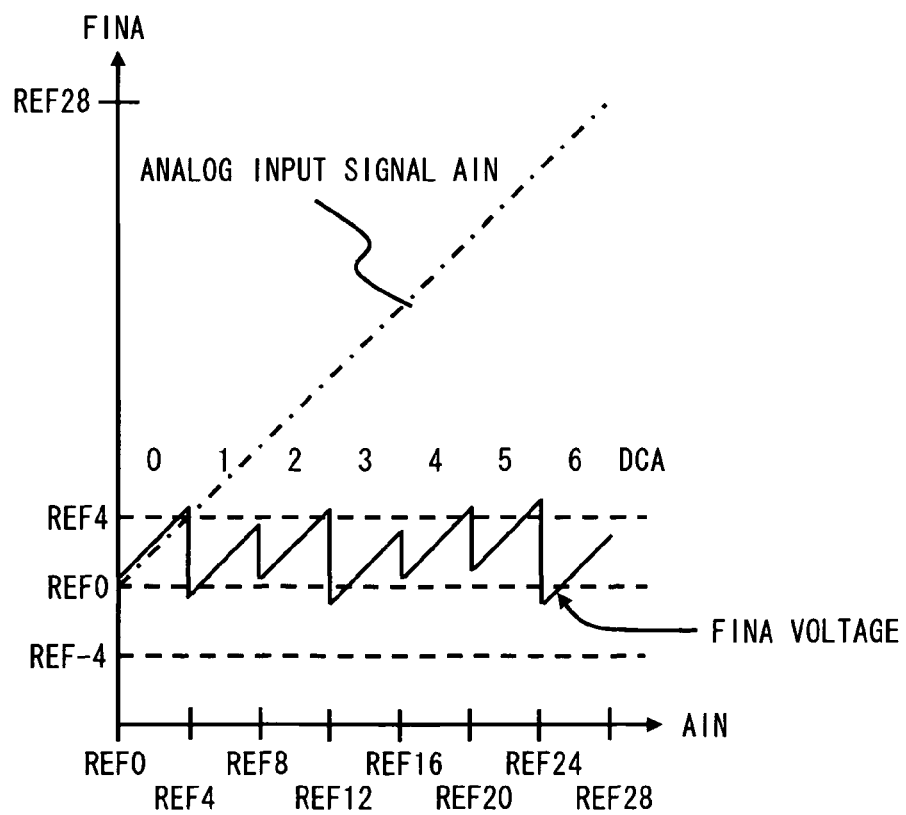
FIG. 12 is a graph showing a relationship between a first residual signal and a signal level of an analog input signal when there is an error in the first lower-order converter according to the first exemplary embodiment.
Figure 13:
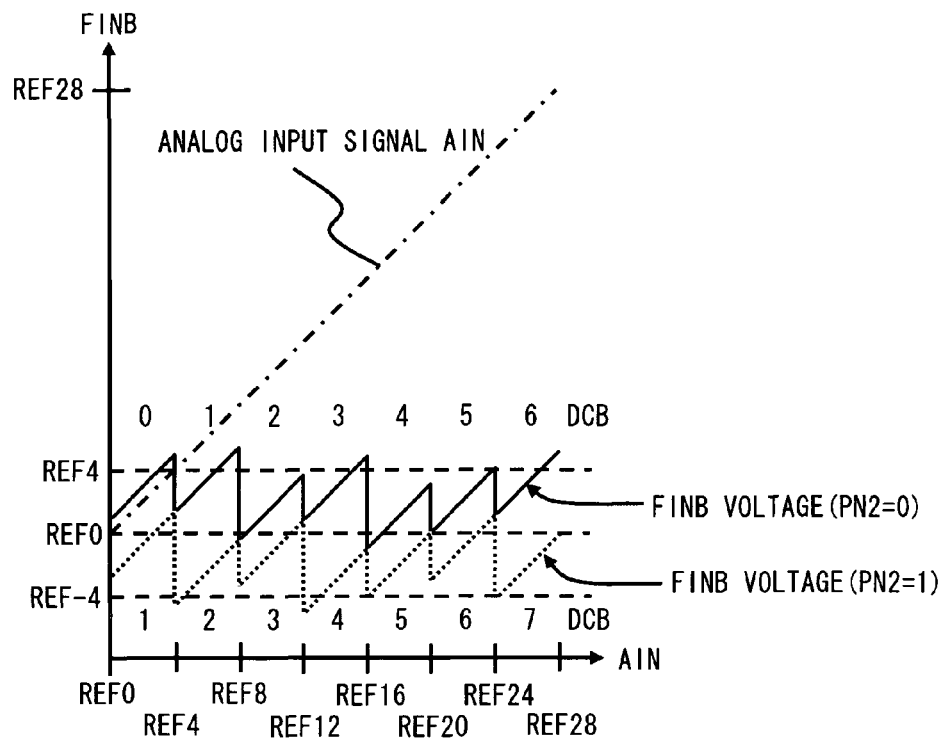
FIG. 13 is a graph showing a relationship between a second residual signal and a signal level of an analog input signal when there is an error in the second lower-order converter according to the first exemplary embodiment.

FIG. 12 shows a relationship between the first residual signal FINA and the analog input signal AIN when there is a variation in the first residual signal generator 20. As shown in FIG. 12, in this case, the first residual signal FINA switches each time the value of the higher-order digital value DCA switches, and its signal level sometimes exceeds the range of the reference voltages REF0 to REF4. Further, FIG. 13 shows a relationship between the second residual signal FINB and the analog input signal AIN when there is a variation in the second residual signal generator 30. As shown in FIG. 13, in this case, the second residual signal FINB switches each time the value of the higher-order digital value DCB switches. During the period when the second control signal PN2 is 0, the signal level of the second residual signal FINB sometimes exceeds the range of the reference voltages REF0 to REF4. Further, during the period when the second control signal PN2 is 1, the signal level of the second residual signal FINB sometimes exceeds the range of the reference voltages REF-4 to REF0.

Then, the AD converter 1 according to the first exemplary embodiment controls the first lower-order converter 12, the second lower-order converter 13 and the calibrator 14 from a first state to a fourth state by using the first control signal PN1, the second control signal PN2 and the third control signal PN3, thereby calibrating the first residual signal FINA and the second residual signal FINB shown in FIGS. 12 and 13 to ideal states shown in FIGS. 4 and 5, respectively.

Figure 14:
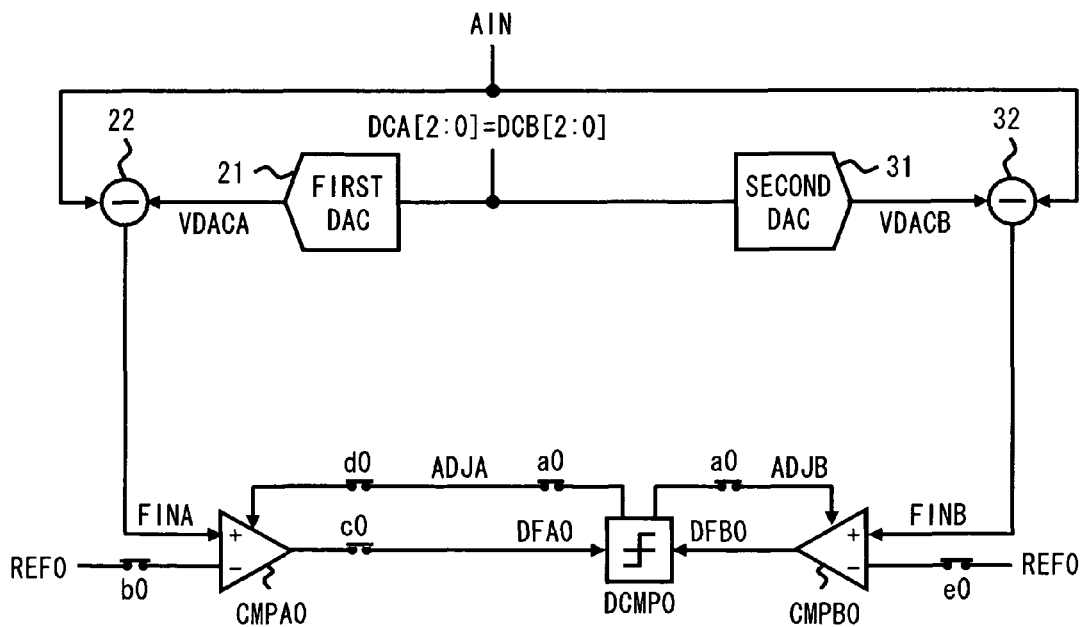
FIG. 14 is a circuit diagram showing an operation in a first state of the AD converter according to the first exemplary embodiment.

First, the first state is described. FIG. 14 shows a connection state of the first lower-order converter 12, the second lower-order converter 13 and the calibrator 14 in the first state. Note that FIG. 14 shows one of a plurality of comparators and digital comparators operating in parallel. As shown in FIG. 14, in the first state, the first control signal PN1 is 0, the second control signal PN2 is 0, and the third control signal PN3 is 0. Therefore, the higher-order digital value DCA supplied to the first DA converter 21 and the higher-order digital value DCB supplied to the second DA converter 31 are the same value. Thus, the first residual signal FINA and the second residual signal FINB are ideally in the range of the reference voltages REF0 to REF4.

Further, the switch a0 is short-circuited in the calibration target selector, the switch b0 is short-circuited in the first barrel shifter, the switch c0 is short-circuited in the second barrel shifter, the switch d0 is short-circuited in the third barrel shifter, and the switch e0 is short-circuited in the fourth barrel shifter. The reference voltage REF0 is thereby input to the comparator CMPA0 and the comparator CMPB0. Further, the comparator CMPA0 outputs a comparison result DFA0 between the reference voltage REF0 and the first residual signal FINA (i.e. the first lower-order digital value corresponding to the reference voltage REF0) to the digital comparator DCMP0. The comparator CMPB0 outputs a comparison result DFB0 between the reference voltage REF0 and the second residual signal FINB (i.e. the second lower-order digital value corresponding to the reference voltage REF0) to the digital comparator DCMP0. Then, based on the comparison result between the first lower-order digital value DFA0 and the second lower-order digital value DFB0, the digital comparator DCMP0 outputs the first offset adjustment signal ADJA to the comparator CMPA0 of the first lower-order AD converter 23 and outputs the second offset adjustment signal ADJB to the comparator CMPB0 of the second lower-order AD converter 33.

Figure 15:
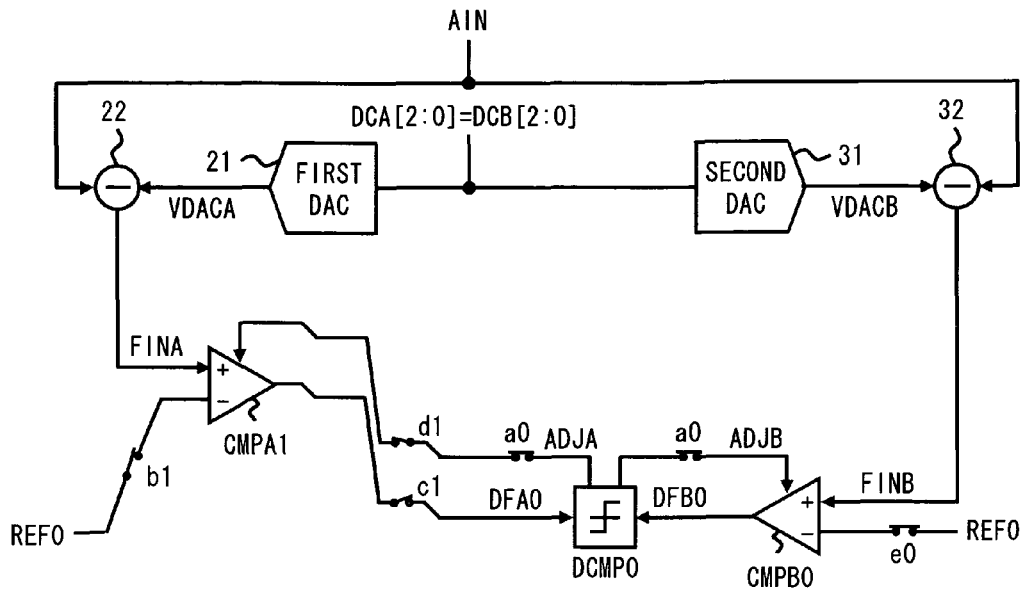
FIG. 15 is a circuit diagram showing an operation in a second state of the AD converter according to the first exemplary embodiment.

Next, the second state is described. FIG. 15 shows a connection state of the first lower-order converter 12, the second lower-order converter 13 and the calibrator 14 in the second state. Note that FIG. 15 shows one of a plurality of comparators and digital comparators operating in parallel. As shown in FIG. 15, in the second state, the first control signal PN1 is 1, the second control signal PN2 is 0, and the third control signal PN3 is 0. Therefore, the higher-order digital value DCA supplied to the first DA converter 21 and the higher-order digital value DCB supplied to the second DA converter 31 are the same value. Thus, the first residual signal FINA and the second residual signal FINB are ideally in the range of the reference voltages REF0 to REF4.

Further, the switch a0 is short-circuited in the calibration target selector, the switch b1 is short-circuited in the first barrel shifter, the switch c1 is short-circuited in the second barrel shifter, the switch d1 is short-circuited in the third barrel shifter, and the switch e0 is short-circuited in the fourth barrel shifter. The reference voltage REF0 is thereby input to the comparator CMPA1 and the comparator CMPB0. Further, the comparator CMPA1 outputs a comparison result DFA0 between the reference voltage REF0 and the first residual signal FINA (i.e. the first lower-order digital value corresponding to the reference voltage REF0) to the digital comparator DCMP0. The comparator CMPB0 outputs a comparison result DFB0 between the reference voltage REF0 and the second residual signal FINB (i.e. the second lower-order digital value corresponding to the reference voltage REF0) to the digital comparator DCMP0. Then, based on the comparison result between the first lower-order digital value DFA0 and the second lower-order digital value DFB0, the digital comparator DCMP0 outputs the first offset adjustment signal ADJA to the comparator CMPA1 of the first lower-order AD converter 23 and outputs the second offset adjustment signal ADJB to the comparator CMPB0 of the second lower-order AD converter 33.

The comparators of the first lower-order AD converter 23 and the second lower-order AD converter 33 have different input offset variations from each other. In the example of FIGS. 14 and 15, the input offset variations can be calibrated among three comparators of the comparators CMPA0, CMPA1 and CMPB0 by repeating the first state and the second state. Specifically, by repeating the first state and the second state, the deviation of the input offset of the comparators of the first lower-order AD converter 23 and the second lower-order AD converter 33 is calibrated to thereby improve the conversion accuracy.

Figure 16:
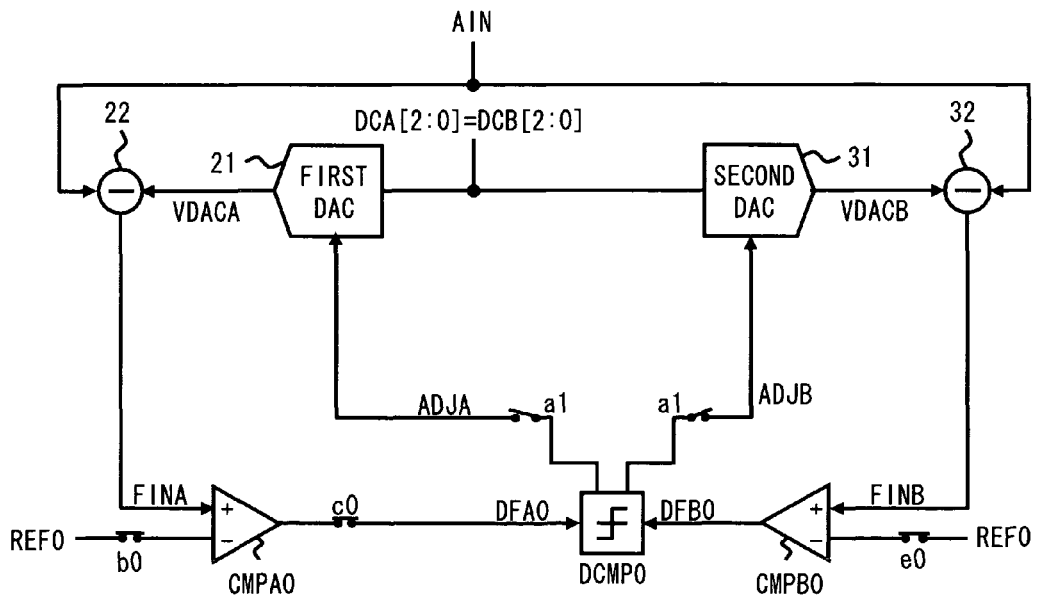
FIG. 16 is a circuit diagram showing an operation in a third state of the AD converter according to the first exemplary embodiment.

Further, the third state is described. FIG. 16 shows a connection state of the first lower-order converter 12, the second lower-order converter 13 and the calibrator 14 in the third state. Note that FIG. 16 shows one of a plurality of comparators and digital comparators operating in parallel. As shown in FIG. 16, in the third state, the first control signal PN1 is 0, the second control signal PN2 is 0, and the third control signal PN3 is 1. Therefore, the higher-order digital value DCA supplied to the first DA converter 21 and the higher-order digital value DCB supplied to the second DA converter 31 are the same value. Thus, the first residual signal FINA and the second residual signal FINB are ideally in the range of the reference voltages REF0 to REF4.

Further, the switch a1 is short-circuited in the calibration target selector, the switch b0 is short-circuited in the first barrel shifter, the switch c0 is short-circuited in the second barrel shifter, the switch d0 is short-circuited in the third barrel shifter, and the switch e0 is short-circuited in the fourth barrel shifter. The reference voltage REF0 is thereby input to the comparator CMPA0 and the comparator CMPB0. Further, the comparator CMPA0 outputs a comparison result DFA0 between the reference voltage REF0 and the first residual signal FINA (i.e. the first lower-order digital value corresponding to the reference voltage REF0) to the digital comparator DCMP0. The comparator CMPB0 outputs a comparison result DFB0 between the reference voltage REF0 and the second residual signal FINB (i.e. the second lower-order digital value corresponding to the reference voltage REF0) to the digital comparator DCMP0. Then, based on the comparison result between the first lower-order digital value DFA0 and the second lower-order digital value DFB0, the digital comparator DCMP0 outputs the first offset adjustment signal ADJA to the first DA converter 21 and outputs the second offset adjustment signal ADJB to the second DA converter 31.

Figure 18:
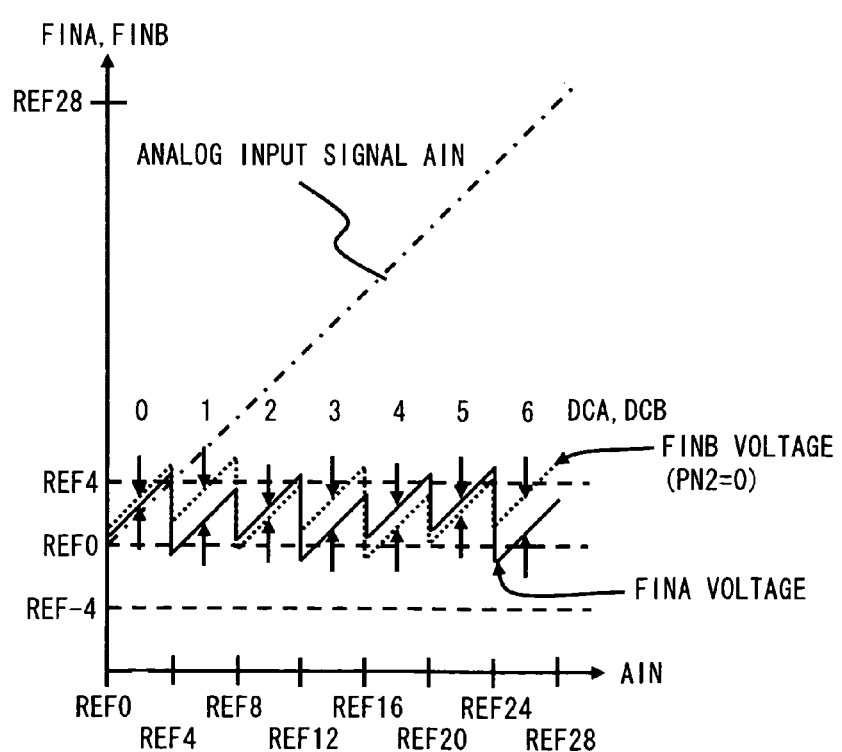
FIG. 18 is a graph showing first and second lower-order analog signals calibrated during a period when the AD converter according to the first exemplary embodiment performs the operation in the third state.

Then, in the first DA converter 21, the conversion calibration value held by the up/down counter which is selected according to the higher-order digital value DCA is updated according to the first offset adjustment signal ADJA. Further, in the second DA converter 31, the conversion calibration value held by the up/down counter which is selected according to the higher-order digital value DCB is updated according to the second offset adjustment signal ADJB. In the third state, if there is no conversion error due to the input offset in the comparators of the first lower-order AD converter 23 and the comparators of the second lower-order AD converter 33, a difference which exists between the first lower-order digital value DFA and the second lower-order digital value DFB can be regarded as an error which exists between the first residual signal FINA output from the first DA converter 21 and the second residual signal FINB output from the second DA converter 31. Therefore, when the first offset adjustment signal ADJA and the second offset adjustment signal ADJB are in reversed polarity to each other in the third state, the signal level difference between the first residual signal FINA and the second residual signal FINB can be reduced by the adjustment signals. FIG. 18 is a graph showing the overview of the calibration processing of the first residual signal FINA and the second residual signal FINB in the third state. As shown in FIG. 18, the signal level difference between the first residual signal FINA and the second residual signal FINB is reduced by the calibration processing in the third state.

Figure 17:
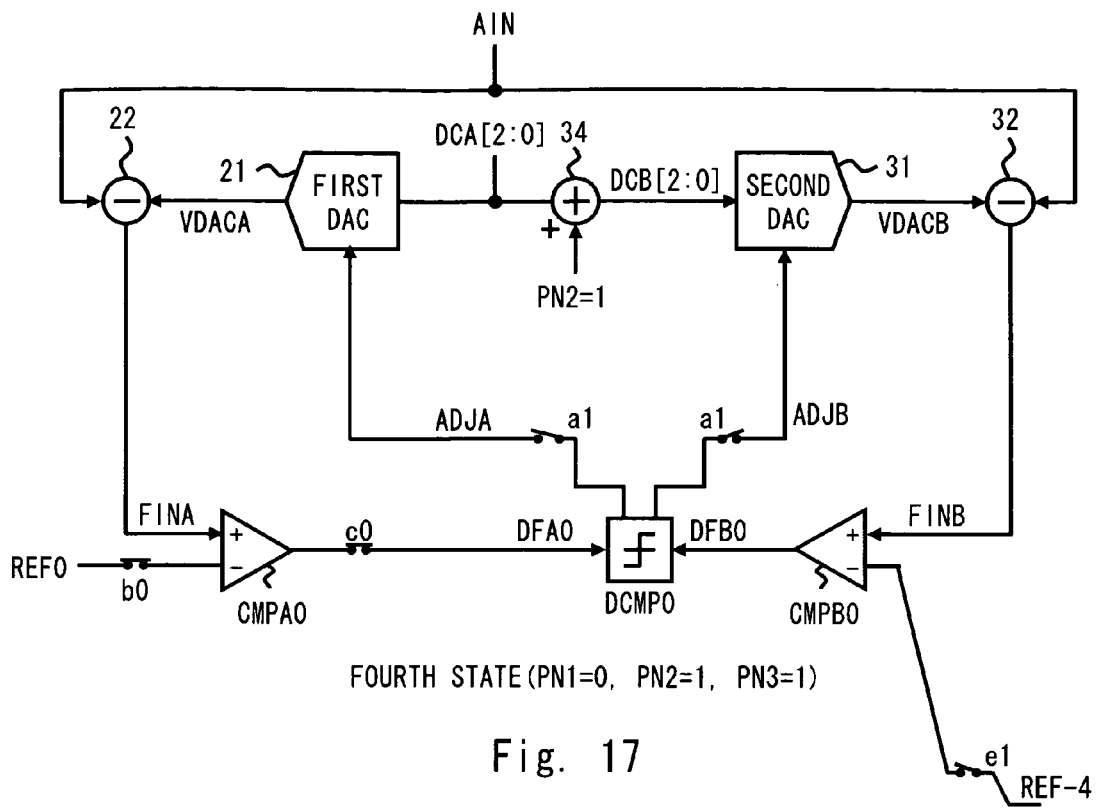
FIG. 17 is a circuit diagram showing an operation in a fourth state of the AD converter according to the first exemplary embodiment.

Furthermore, the fourth state is described. FIG. 17 shows a connection state of the first lower-order converter 12, the second lower-order converter 13 and the calibrator 14 in the fourth state. Note that FIG. 17 shows one of a plurality of comparators and digital comparators operating in parallel. As shown in FIG. 17, in the fourth state, the first control signal PN1 is 0, the second control signal PN2 is 1, and the third control signal PN3 is 1. Therefore, the higher-order digital value DCB supplied to the second DA converter 31 is larger by one than the higher-order digital value DCA supplied to the first DA converter 21. Thus, the first residual signal FINA is ideally in the range of the reference voltages REF0 to REF4, and the second residual signal FINB is ideally in the range of the reference voltages REF-4 to REF0.

Further, the switch a1 is short-circuited in the calibration target selector, the switch b0 is short-circuited in the first barrel shifter, the switch c0 is short-circuited in the second barrel shifter, the switch d0 is short-circuited in the third barrel shifter, and the switch e1 is short-circuited in the fourth barrel shifter. The reference voltage REF0 is thereby input to the comparator CMPA0, and the reference voltage REF-4 is input to the comparator CMPB0. Further, the comparator CMPA0 outputs a comparison result DFA0 between the reference voltage REF0 and the first residual signal FINA (i.e. the first lower-order digital value corresponding to the reference voltage REF0) to the digital comparator DCMP0. The comparator CMPB0 outputs a comparison result DFB0 between the reference voltage REF-4 and the second residual signal FINB (i.e. the second lower-order digital value corresponding to the reference voltage REF-4) to the digital comparator DCMP0. Then, based on the comparison result between the first lower-order digital value DFA0 and the second lower-order digital value DFB0, the digital comparator DCMP0 outputs the first offset adjustment signal ADJA to the first DA converter 21 and outputs the second offset adjustment signal ADJB to the second DA converter 31.

Figure 19:
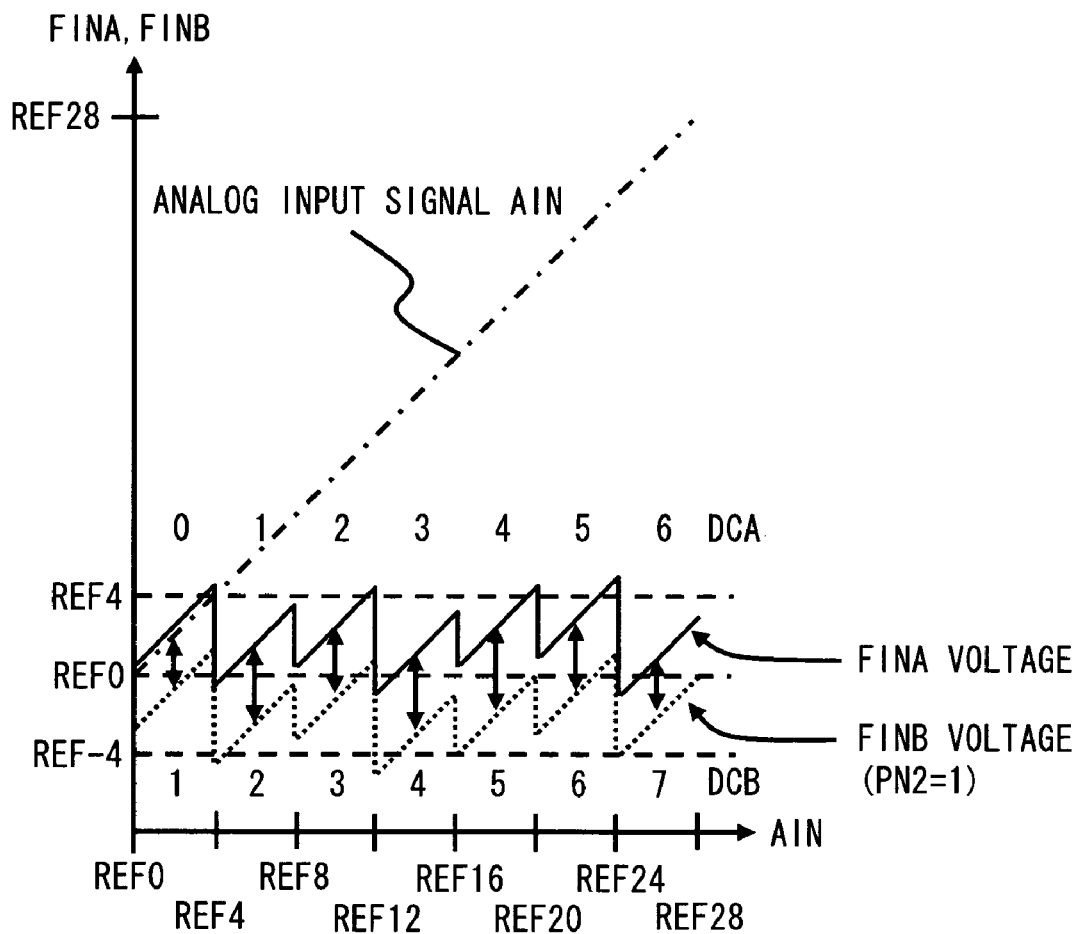
FIG. 19 is a graph showing first and second lower-order analog signals calibrated during a period when the AD converter according to the first exemplary embodiment performs the operation in the fourth state.

In the fourth state, the second residual signal FINB is ideally a value smaller than the first residual signal FINA by $4V_{LSB}$. Therefore, the second lower-order digital value DFB that is output from the comparator CMPB0 to which the reference voltage REF-4 is input and the first lower-order digital value DFA that is output from the comparator CMPA0 to which the reference voltage REF0 is input are ideally the same value. Thus, in the fourth state, in the ideal state where a difference between the first residual signal FINA and the second residual signal FINB is $4V_{LSB}$, the first offset adjustment signal ADJA and the second offset adjustment signal ADJB instruct to maintain the conversion calibration value. On the other hand, in the state where a difference between the first residual signal FINA and the second residual signal FINB is not $4V_{LSB}$, the first offset adjustment signal ADJA and the second offset adjustment signal ADJB instruct to update the conversion calibration value. In this manner, in the fourth state, calibration is made so that the voltage range of the residual signal is in the range of $4V_{LSB}$ (the voltage range of REF0 to REF4) at one higher-order digital value DCA. FIG. 19 is a graph showing the overview of the calibration processing of the first residual signal FINA and the second residual signal FINB in the fourth state. As shown in FIG. 19, the signal level difference between the first residual signal FINA and the second residual signal FINB is calibrated to $4V_{LSB}$ by the calibration processing in the fourth state.

As described above, in the AD converter 1 according to the first exemplary embodiment, the conversion calibration value of the first lower-order converter 12 and the second lower-order converter 13 is set based on the comparison result between the first lower-order digital value DFA and the second lower-order digital value DFB. Therefore, in the AD converter 1 according to the first exemplary embodiment, the calibration processing can be performed regardless of the signal level of the analog input signal AIN. Note that, although the first offset adjustment signal ADJA which is output to the first DA converter 21 and the second offset adjustment signal ADJB which is output to the second DA converter 31 are output only from the digital comparator DCMP0 in the above-described exemplary embodiment, those offset adjustment signals may be output from a plurality of digital comparators, so that the calibration processing of the first DA converter 21 and the second DA converter 31 can be performed at any signal level of the analog input signal AIN.

Further, in the AD converter 1 according to the first exemplary embodiment, the second lower-order converter generates the second residual signal according to the higher-order digital value DCA during the first period (e.g. the third state shown in FIG. 16) and generates the second residual signal according to the higher-order digital value DCA shifted at least by 1LSB (the higher-order digital value DCB in FIG. 1) during the second period (e.g. the fourth state shown in FIG. 17). By performing the operation in the first period and the operation in the second period repeatedly in this manner, the AD converter 1 can calibrate a conversion error occurring in the first DA converter 21 and the second DA converter 31. The calibration processing enables elimination of the deviation between the first DA converter 21 and the second DA converter 31 and calibration of the voltage range of the first residual signal FINA and the second residual signal FINB. Thus, even when the signal level of the first residual signal FINA and the signal level of the second residual signal FINB are shifted from the ideal state, the AD converter 1 can calibrate the shift.

Further, in the AD converter 1 according to the first exemplary embodiment, by repeating the first state and the second state during the first period, it is possible to reduce the variation of the input offset which exists in the comparators of the lower-order AD converter.

Because the above-described calibration processing is carried out as background processing, the AD converter 1 can perform the calibration processing, keeping up with variations (e.g. power supply voltage variation, ambient temperature variation etc.) of operating conditions of the circuit while performing signal processing. The AD converter 1 can thereby always maintain the suitable conversion accuracy regardless of changes in operating conditions.

[Second Exemplary Embodiment]

In a second exemplary embodiment, an example of an AD converter in which a calibration value holding unit is included only in a lower-order AD converter is described as an alternative example of the AD converter according to the present invention. It should be noted that, in the description of an AD converter 2 according to the second exemplary embodiment, the same elements as in the AD converter 1 according to the first exemplary embodiment are denoted by the same reference symbols as in the first exemplary embodiment and not redundantly described.

Figure 20:
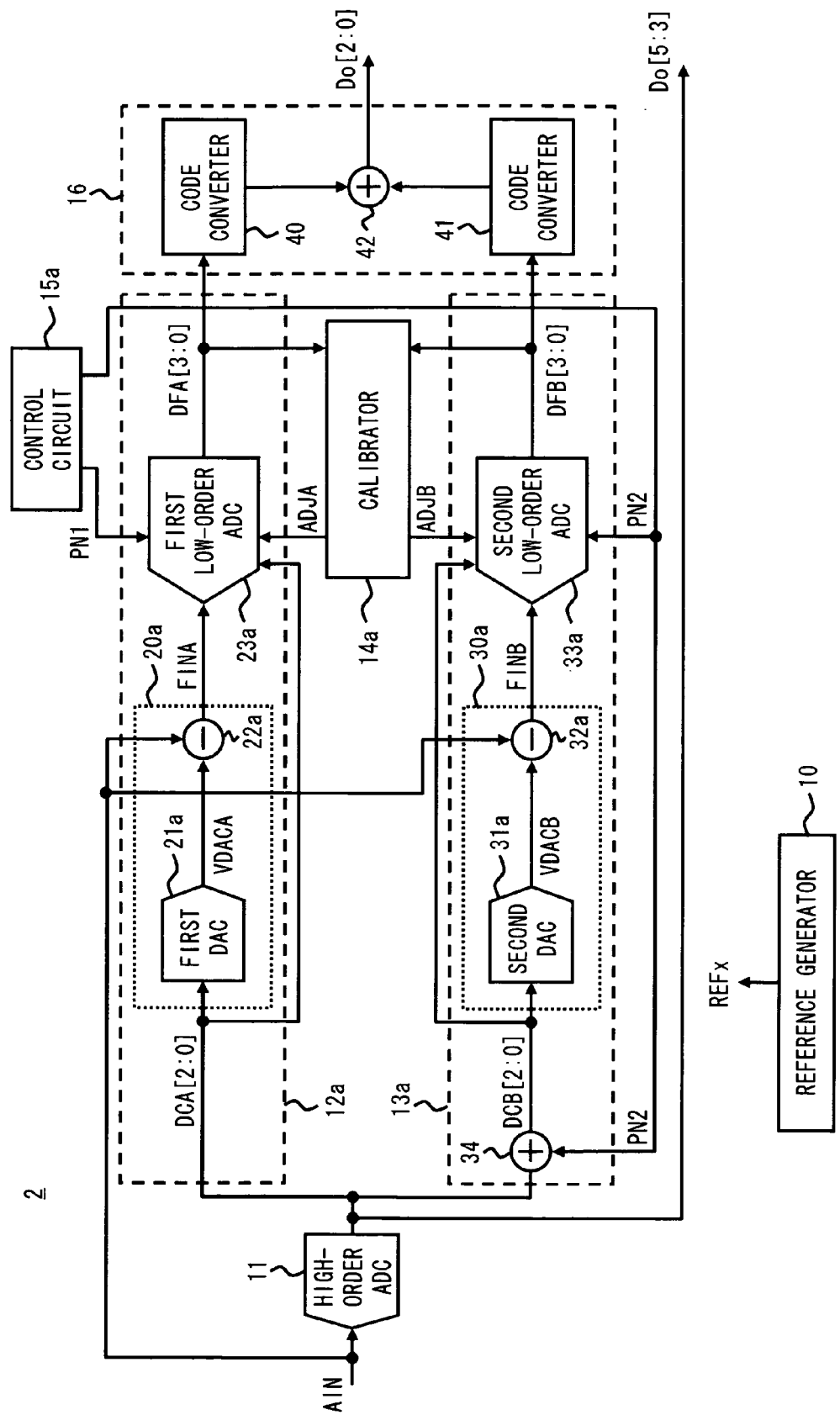
FIG. 20 is a block diagram of an AD converter according to a second exemplary embodiment.

FIG. 20 is a block diagram of the AD converter 2 according to the second exemplary embodiment. Referring to FIG. 20, the AD converter 2 includes a first lower-order converter 12a, a second lower-order converter 13a, a calibrator 14a and a control circuit 15a in place of the first lower-order converter 12, the second lower-order converter 13, the calibrator 14 and the control circuit 15.

The first lower-order converter 12a includes a first residual signal generator 20a and a first lower-order AD converter 23a. The first residual signal generator 20a has a configuration in which the function of calibrating the signal level of the first residual signal FINA is eliminated from the first residual signal generator 20. Therefore, the first offset adjustment signal ADJA is not input to the first residual signal generator 20a.

The first residual signal generator 20a includes a first DA converter 21a and a subtracter 22a. The first DA converter 21a outputs the analog value VDACA which corresponds to the higher-order digital value DCA. The subtracter 22a outputs a difference between the signal level of the analog input signal AIN and the analog value VDACA as the first residual signal FINA.

The first lower-order AD converter 23a converts the first residual signal FINA into the first lower-order digital value DFA. The higher-order digital value DCA is input to the first lower-order AD converter 23a. The first lower-order AD converter 23a includes a calibration value holding unit that increases and decreases a conversion calibration value based on the first offset adjustment signal ADJA with respect to each value of the higher-order digital value DCA. Thus, in the second exemplary embodiment, the calibration processing of the input offset of the first lower-order AD converter 23a is performed including a conversion error of the first DA converter 21a. The detailed configuration of the first lower-order AD converter 23a is described later.

The second lower-order converter 13a includes a level shifter 34, a second residual signal generator 30a, and a second lower-order AD converter 33a. The second residual signal generator 30a has a configuration in which the function of calibrating the signal level of the second residual signal FINB is eliminated from the second residual signal generator 30. Therefore, the second offset adjustment signal ADJB is not input to the second residual signal generator 30a.

The second residual signal generator 30a includes a second DA converter 31a and a subtracter 32a. The second DA converter 31a outputs the analog value VDACB which corresponds to the higher-order digital value DCB. The subtracter 32a outputs a difference between the signal level of the analog input signal AIN and the analog value VDACB as the second residual signal FINB.

The second lower-order AD converter 33a converts the second residual signal FINB into the second lower-order digital value DFB. The higher-order digital value DCB is input to the second lower-order AD converter 33a. The second lower-order AD converter 33a includes a calibration value holding unit that increases and decreases a conversion calibration value based on the second offset adjustment signal ADJB with respect to each value of the higher-order digital value DCB. Thus, in the second exemplary embodiment, the calibration processing of the input offset of the second lower-order AD converter 33a is performed including a conversion error of the second DA converter 31a.

The calibrator 14a outputs the first offset adjustment signal ADJA and the second offset adjustment signal ADJB based on a difference between the first lower-order digital value DFA and the second lower-order digital value DFB. Further, the calibrator 14a outputs the first offset adjustment signal ADJA and the second offset adjustment signal ADJB only to the first lower-order AD converter 23a and the second lower-order AD converter 33a. The control circuit 15a has a configuration in which the function of generating the third control signal PN3 is eliminated from the control circuit 15.

The first residual signal generator 20a, the second residual signal generator 30a, the first lower-order AD converter 23a, the second lower-order AD converter 33a and the calibrator 14a, which are described above, are described in further detail hereinbelow. First, the first residual signal generator 20a and the second residual signal generator 30a are described. The first residual signal generator 20a and the second residual signal generator 30a are substantially the same circuit, and the first residual signal generator 20a is described hereinafter.

Figure 21:
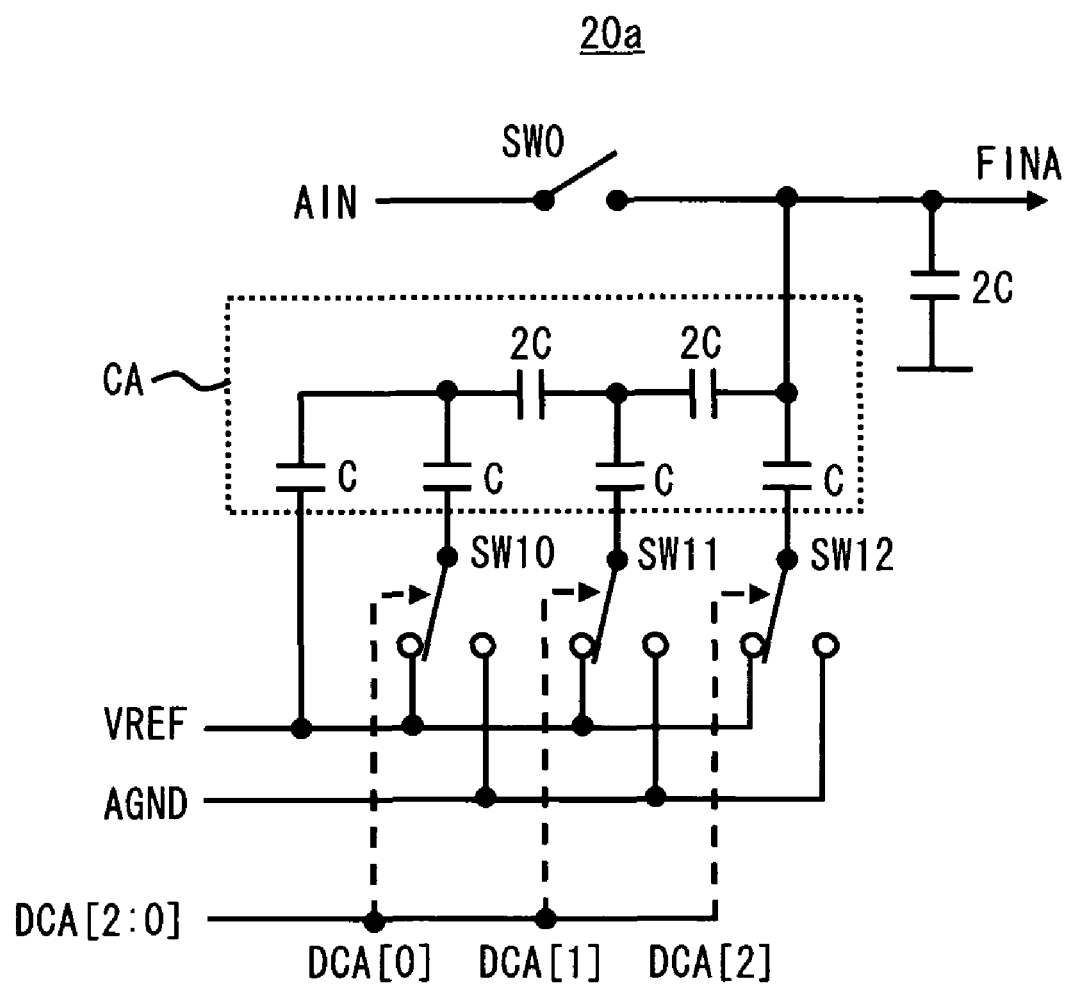
FIG. 21 is a circuit diagram of a residual signal generator according to the second exemplary embodiment.

FIG. 21 is a block diagram of the first residual signal generator 20a. Referring to FIG. 21, the first residual signal generator 20a is an AD converter that has a capacitor array CA, and the function of the subtracter 22a shown in FIG. 20 is implemented by the operation of the AD converter. As shown in FIG. 21, the DA converter according to the second exemplary embodiment has a configuration in which the switches SW20 to SW23 used for calibration of residual signals, the capacitors placed corresponding to the switches SW20 to SW23, and the up/down counters 200 to 207 are eliminated from the DA converter according to the first exemplary embodiment. Further, the operation of the DA converter according to the second exemplary embodiment is not substantially different from the operation of the DA converter according to the first exemplary embodiment.

Figure 22:
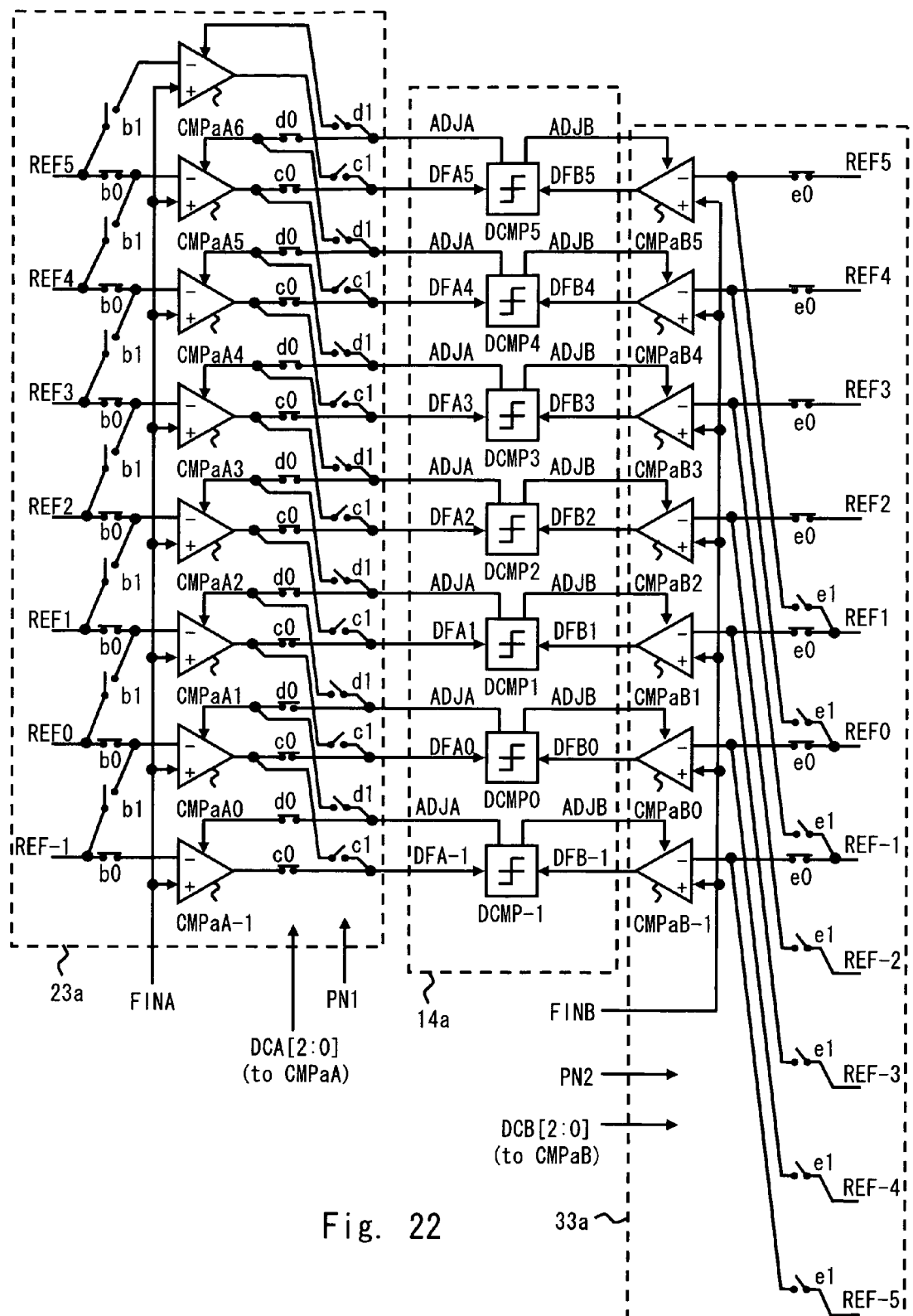
FIG. 22 is a circuit diagram of a lower-order AD converter according to the second exemplary embodiment.

Next, the first lower-order AD converter 23a, the second lower-order AD converter 33a and the calibrator 14a are described in detail. FIG. 22 is a block diagram of the first lower-order AD converter 23a, the second lower-order AD converter 33a and the calibrator 14a.

Referring to FIG. 22, the calibrator 14a has a configuration in which the calibration target selector is eliminated from the calibrator 14. Further, the connection of the first lower-order AD converter 23a and the second lower-order AD converter 33a with the comparators and the barrel shifters is the same as that of the first lower-order AD converter 23 and the second lower-order AD converter 33 according to the first exemplary embodiment. However, the AD converter 2 according to the second exemplary embodiment is different from the AD converter 1 according to the first exemplary embodiment in that the higher-order digital value DCA is input to comparators CMPaA-1 to COMPaA6 of the first lower-order AD converter 23a, and the higher-order digital value DCB is input to comparators CMPaB-1 to COMPaB5 of the second lower-order AD converter 33a.

The comparators which are used in the first lower-order AD converter 23a and the second lower-order AD converter 33a are described hereinbelow. Because the comparators which are used in the first lower-order AD converter 23a and the second lower-order AD converter 33a are substantially the same, the comparator CMPaA0 is described as an example.

Figure 23:
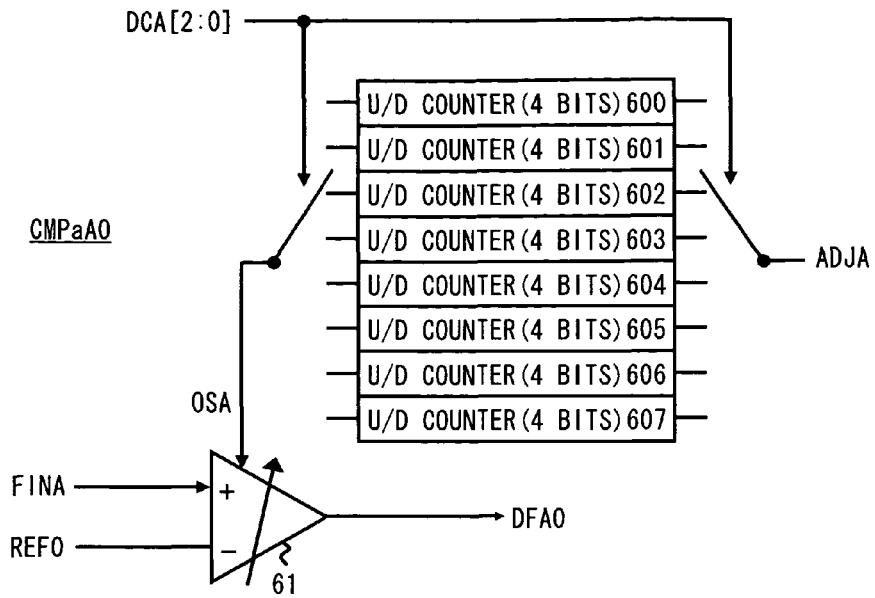
FIG. 23 is a block diagram of a comparator of the lower-order AD converter according to the second exemplary embodiment.

FIG. 23 is a block diagram of the comparator CMPaA0. Referring to FIG. 23, the comparator CMPaA0 includes calibration value holding units 600 to 607 and a comparator 61. The calibration value holding units 600 to 607 are up/down counters. In the second exemplary embodiment, any one of the calibration value holding units 600 to 607 is selected according to the higher-order digital value DCA. Then, the selected up/down counter increases and decreases the held conversion calibration value OSA based on the value of the first offset adjustment signal ADJA. The comparator 61 changes the input offset voltage based on the conversion calibration value OSA. Then, the comparator 61 performs comparison based on the input offset voltage which has been changed based on the held conversion calibration value OSA.

The operation of the AD converter 2 according to the second exemplary embodiment is described hereinafter. The AD converter 2 according to the second exemplary embodiment controls the first lower-order converter 12a and the second lower-order converter 13a from a first state to a third state by using the first control signal PN1 and the second control signal PN2, thereby calibrating the conversion result to the ideal state.

Figure 24:
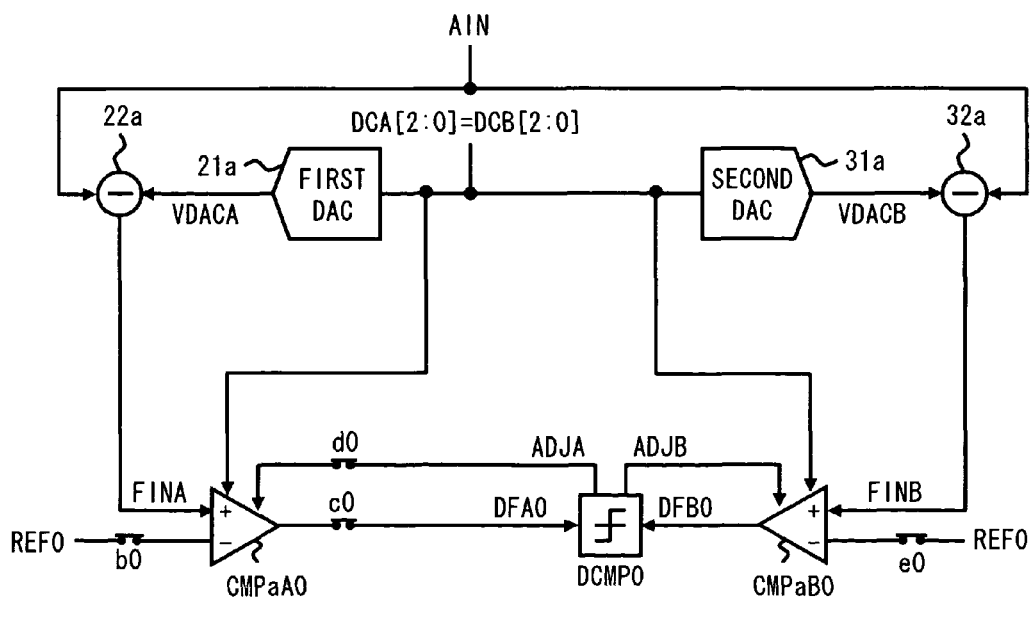
FIG. 24 is a circuit diagram showing an operation in a first state of the AD converter according to the second exemplary embodiment.

First, the first state is described. FIG. 24 shows a connection state of the first lower-order converter 12a, the second lower-order converter 13a and the calibrator 14a in the first state. Note that FIG. 24 shows one of a plurality of comparators and digital comparators operating in parallel. As shown in FIG. 24, in the first state, the first control signal PN1 is 0, and the second control signal PN2 is 0. Therefore, the higher-order digital value DCA supplied to the first DA converter 21a and the higher-order digital value DCB supplied to the second DA converter 31a are the same value. Thus, the first residual signal FINA and the second residual signal FINB are ideally in the range of the reference voltages REF0 to REF4.

Further, the switch b0 is short-circuited in the first barrel shifter, the switch c0 is short-circuited in the second barrel shifter, the switch d0 is short-circuited in the third barrel shifter, and the switch e0 is short-circuited in the fourth barrel shifter. The reference voltage REF0 is thereby input to the comparator CMPaA0 and the comparator CMPaB0. Further, the comparator CMPaA0 outputs a comparison result DFA0 between the reference voltage REF0 and the first residual signal FINA (i.e. the first lower-order digital value corresponding to the reference voltage REF0) to the digital comparator DCMP0. The comparator CMPaB0 outputs a comparison result DFB0 between the reference voltage REF0 and the second residual signal FINB (i.e. the second lower-order digital value corresponding to the reference voltage REF0) to the digital comparator DCMP0. Then, based on the comparison result between the first lower-order digital value DFA0 and the second lower-order digital value DFB0, the digital comparator DCMP0 outputs the first offset adjustment signal ADJA to the comparator CMPaA0 of the first lower-order AD converter 23a and outputs the second offset adjustment signal ADJB to the comparator CMPaB0 of the second lower-order AD converter 33a.

Figure 25:
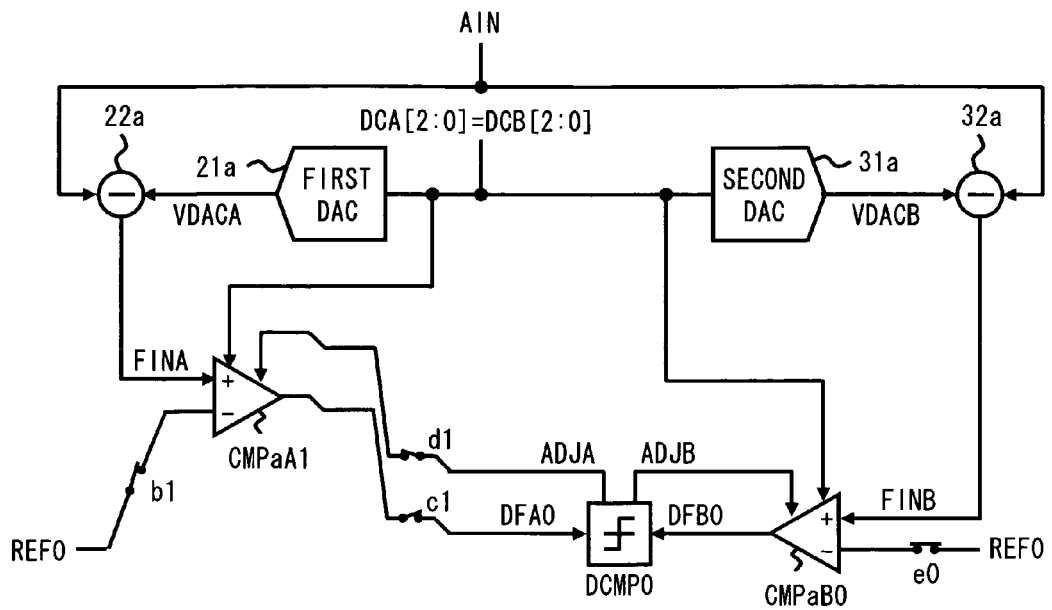
FIG. 25 is a circuit diagram showing an operation in a second state of the AD converter according to the second exemplary embodiment.

Next, the second state is described. FIG. 25 shows a connection state of the first lower-order converter 12a, the second lower-order converter 13a and the calibrator 14a in the second state. Note that FIG. 25 shows one of a plurality of comparators and digital comparators operating in parallel. As shown in FIG. 25, in the second state, the first control signal PN1 is 1, and the second control signal PN2 is 0. Therefore, the higher-order digital value DCA supplied to the first DA converter 21a and the higher-order digital value DCB supplied to the second DA converter 31a are the same value. Thus, the first residual signal FINA and the second residual signal FINB are ideally in the range of the reference voltages REF0 to REF4.

Further, the switch b1 is short-circuited in the first barrel shifter, the switch c1 is short-circuited in the second barrel shifter, the switch d1 is short-circuited in the third barrel shifter, and the switch e0 is short-circuited in the fourth barrel shifter. The reference voltage REF0 is thereby input to the comparator CMPaA1 and the comparator CMPaB0. Further, the comparator CMPaA1 outputs a comparison result DFA0 between the reference voltage REF0 and the first residual signal FINA (i.e. the first lower-order digital value corresponding to the reference voltage REF0) to the digital comparator DCMP0. The comparator CMPaB0 outputs a comparison result DFB0 between the reference voltage REF0 and the second residual signal FINB (i.e. the second lower-order digital value corresponding to the reference voltage REF0) to the digital comparator DCMP0. Then, based on the comparison result between the first lower-order digital value DFA0 and the second lower-order digital value DFB0, the digital comparator DCMP0 outputs the first offset adjustment signal ADJA to the comparator CMPaA1 of the first lower-order AD converter 23a and outputs the second offset adjustment signal ADJB to the comparator CMPaB0 of the second lower-order AD converter 33a.

Figure 26:
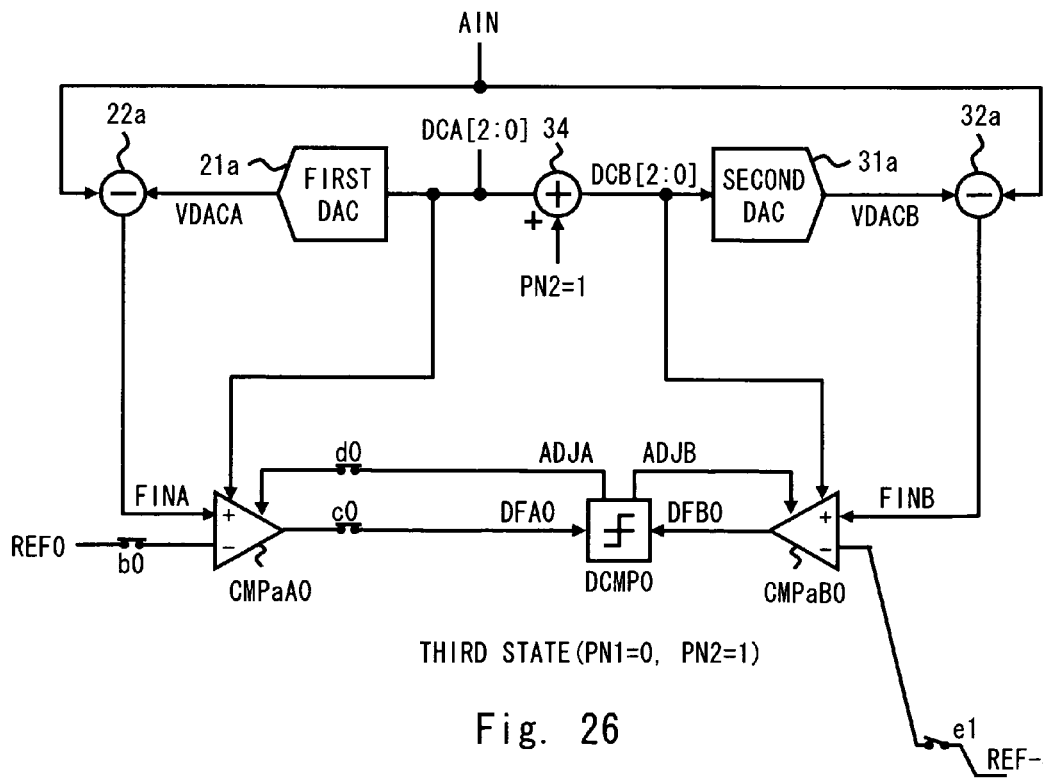
FIG. 26 is a circuit diagram showing an operation in a third state of the AD converter according to the second exemplary embodiment.
Figure 27:
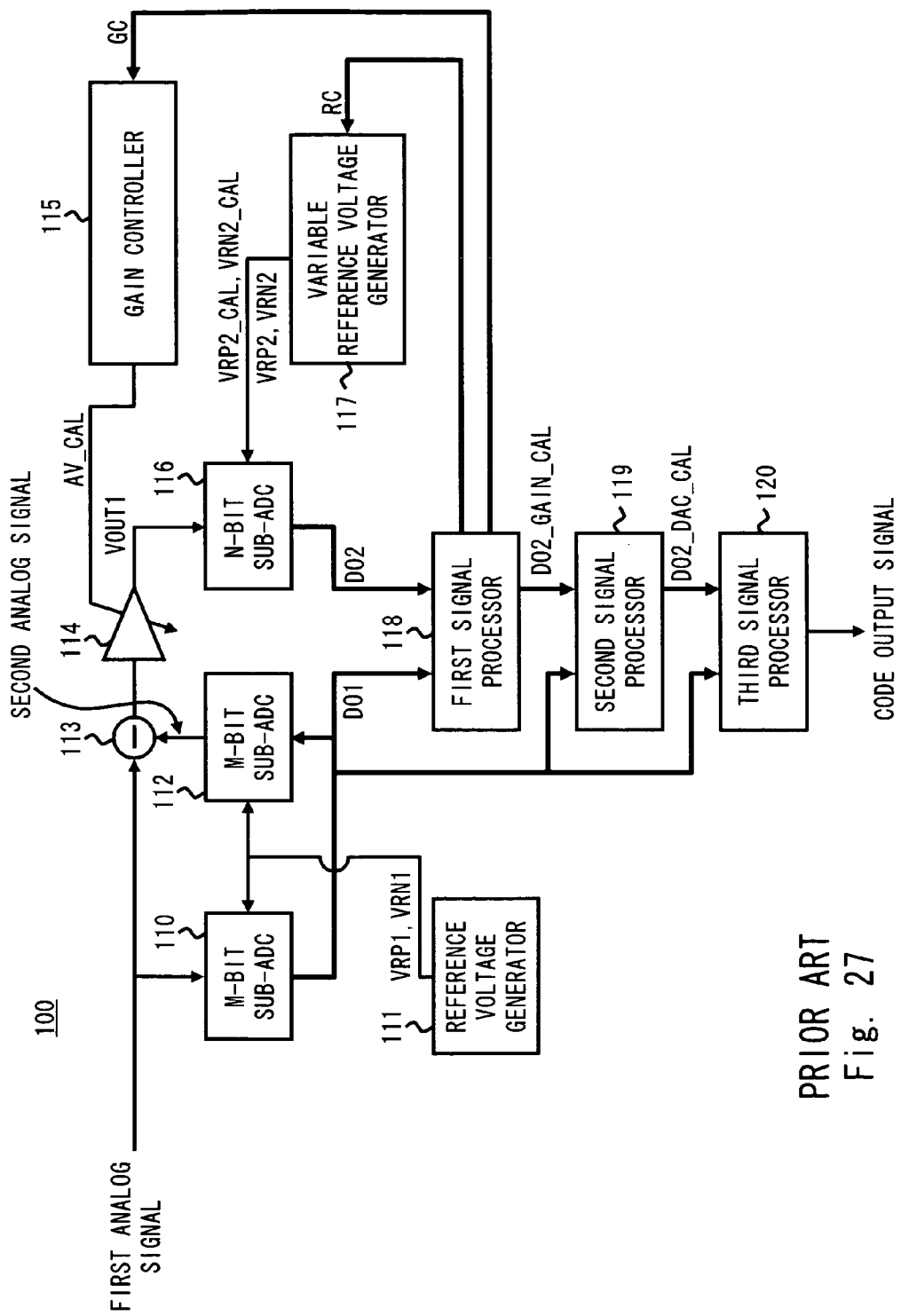
FIG. 27 is a block diagram of an AD converter disclosed in U.S. Pat. No. 7,142,138.
Figure 28:
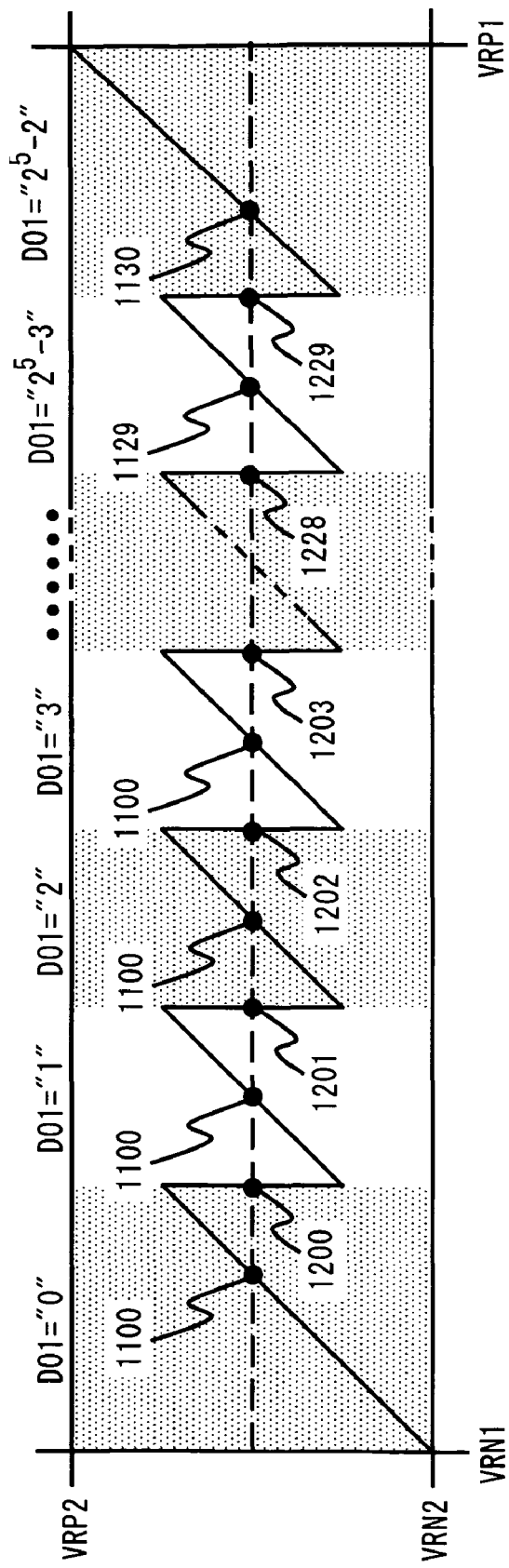
FIG. 28 is a graph showing a relationship between a first analog input signal and a residual signal VOUT1 of the AD converter disclosed in U.S. Pat. No. 7,142,138.

Further, the third state is described. FIG. 26 shows a connection state of the first lower-order converter 12a, the second lower-order converter 13a and the calibrator 14a in the third state. Note that FIG. 26 shows one of a plurality of comparators and digital comparators operating in parallel. As shown in FIG. 26, in the third state, the first control signal PN1 is 0, and the second control signal PN2 is 1. Therefore, the higher-order digital value DCB supplied to the second DA converter 31a is larger by one than the higher-order digital value DCA supplied to the first DA converter 21a. Thus, the first residual signal FINA is ideally in the range of the reference voltages REF0 to REF4, and the second residual signal FINB is ideally in the range of the reference voltages REF-4 to REF0.

Further, the switch b0 is short-circuited in the first barrel shifter, the switch c0 is short-circuited in the second barrel shifter, the switch d0 is short-circuited in the third barrel shifter, and the switch e1 is short-circuited in the fourth barrel shifter. The reference voltage REF0 is thereby input to the comparator CMPaA0, and the reference voltage REF-4 is input to the comparator CMPaB0. Further, the comparator CMPaA0 outputs a comparison result DFA0 between the reference voltage REF0 and the first residual signal FINA (i.e. the first lower-order digital value corresponding to the reference voltage REF0) to the digital comparator DCMP0. The comparator CMPaB0 outputs a comparison result DFB0 between the reference voltage REF-4 and the second residual signal FINB (i.e. the second lower-order digital value corresponding to the reference voltage REF-4) to the digital comparator DCMP0. Then, based on the comparison result between the first lower-order digital value DFA0 and the second lower-order digital value DFB0, the digital comparator DCMP0 outputs the first offset adjustment signal ADJA to the first lower-order AD converter 23a and outputs the second offset adjustment signal ADJB to the comparator CMPaB0 of the second lower-order AD converter 33a.

In the AD converter 2 according to the second exemplary embodiment, calibration of the input offsets of the comparators CMPaA-1 to CMPaA6 and CMPaB-1 to CMPaB5 is made in the first state and the second state. Further, in the AD converter 2, calibration for the signal levels of the first residual signal FINA and the second residual signal FINB is made in the first state and the third state. Thus, the calibration processing performed in the first state and the second state of the AD converter 2 corresponds to the calibration processing performed in the first state and the second state of the AD converter 1. Further, the calibration processing performed in the first state and the third state of the AD converter 2 corresponds to the calibration processing performed in the third state and the fourth state of the AD converter 1.

As described above, the AD converter 2 according to the second exemplary embodiment, like the AD converter 1 according to the first exemplary embodiment, can achieve improvement of the conversion accuracy regardless of the signal level of the analog input signal by the calibration processing as the background processing.

Further, in the AD converter 2 according to the second exemplary embodiment, the comparators CMPaA-1 to CMPaA6 and CMPaB-1 to CMPaB5 hold conversion calibration values with respect to each higher-order digital value DCA (or DCB). Therefore, the AD converter 2 can increase the speed of the conversion processing just like the case where the calibration target selectors are placed for all digital comparators in the AD converter 1 according to the first exemplary embodiment.

Note that the update of the conversion calibration value which is described in the first and second exemplary embodiments is performed in synchronization with the comparison timing of the digital comparators (e.g. the cycle of clocks supplied to the digital comparators).

The present invention is not limited to the above-described exemplary embodiments, and various changes and modifications may be made without departing from the scope of the invention. For example, the DA converter may be a circuit in a different form from the above exemplary embodiments. The DA converter may be implemented by a resistor array that is composed of resistors having a resistance value R and resistors having a resistance value 2R, rather than the capacitor array CA.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An analog-to-digital converter comprising:
    a higher-order analog-to-digital converter that outputs a higher-order digital value corresponding to a signal level of an analog input signal;
    a first lower-order converter that generates a first residual signal based on the higher-order digital value and the analog input signal, and converts the first residual signal into a first lower-order digital value;
    a second lower-order converter that generates a second residual signal based on the higher-order digital value and the analog input signal, and converts the second residual signal into a second lower-order digital value; and
    a calibrator that outputs a first offset adjustment signal and a second offset adjustment signal for respectively designating offset adjustment amounts in reversed polarity based on a difference between the first and second lower-order digital values,
    wherein the first lower-order converter and the second lower-order converter set a conversion calibration value based on the first and second offset adjustment signals, and calibrate the first and second lower-order digital values based on the conversion calibration value.

2. The analog-to-digital converter according to claim 1, wherein the second lower-order converter generates the second residual signal according to the higher-order digital value during a first period, and generates the second residual signal according to the higher-order digital value shifted at least by 1LSB during a second period.

3. The analog-to-digital converter according to claim 1, wherein
the calibrator includes a plurality of match/mismatch determination circuits that respectively compare bit values of the first and second lower-order digital values, and
the plurality of match/mismatch determination circuits output the first and second offset adjustment signals for respectively designating offset adjustment amounts in reversed polarity when the bit value of the first lower-order digital value and the bit value of the second lower-order digital value are different, and output the first and second offset adjustment signals for designating maintaining offset adjustment amounts when the bit value of the first lower-order digital value and the bit value of the second lower-order digital value are the same.

4. The analog-to-digital converter according to claim 1, wherein
the first lower-order converter includes a first residual signal generator that outputs the first residual signal corresponding to a difference between an analog value corresponding to the higher-order digital value and the signal level of the analog input signal, and a first lower-order analog-to-digital converter that outputs the first lower-order digital value based on the first residual signal, and
the second lower-order converter includes a level shifter that shifts the higher-order digital value according to a first control signal, a second residual signal generator that outputs the second residual signal corresponding to a difference between the signal level of the analog input signal and an analog value corresponding to the higher-order digital value output from the level shifter, and a second lower-order analog-to-digital converter that outputs the second lower-order digital value based on the second residual signal.

5. The analog-to-digital converter according to claim 4, wherein
the first residual signal generator includes a calibration value holding unit that increases and decreases the conversion calibration value based on the first offset adjustment signal with respect to each value of the higher-order digital value, and calibrates a signal level of the first residual signal based on the conversion calibration value,
the second residual signal generator includes a calibration value holding unit that increases and decreases the conversion calibration value based on the second offset adjustment signal with respect to each value of the higher-order digital value output from the level shifter, and calibrates a signal level of the second residual signal based on the conversion calibration value,
the first lower-order analog-to-digital converter includes a plurality of comparators that include a calibration value holding unit that holds the conversion calibration value, increase and decrease the conversion calibration value based on the first offset adjustment signal, and calibrate an input offset voltage based on the conversion calibration value, and
the second lower-order analog-to-digital converter includes a plurality of comparators that include a calibration value holding unit that holds the conversion calibration value, increase and decrease the conversion calibration value based on the second offset adjustment signal, and calibrate an input offset voltage based on the conversion calibration value.

6. The analog-to-digital converter according to claim 5, wherein the calibrator includes a plurality of match/mismatch determination circuits that compare the first lower-order digital value and the second lower-order digital value with respect to each corresponding bit values, and a calibration target selector that supplies the first and second offset adjustment signals to one of the first and second lower-order analog-to-digital converters and the first and second residual signal generators for at least one of the plurality of match/mismatch determination circuits.

7. The analog-to-digital converter according to claim 4, wherein
the first lower-order analog-to-digital converter includes:
a first barrel shifter that supplies one of a first reference voltage and a second reference voltage to a first comparator included in the plurality of comparators,
a second barrel shifter that switches between outputting an output of the first comparator as a bit value of the first lower-order digital value corresponding to the first reference voltage and outputting the output of the first comparator as a bit value of the first lower-order digital value corresponding to the second reference voltage, and
a third barrel shifter that supplies one of the first offset adjustment signal corresponding to the first reference voltage and the first offset adjustment signal corresponding to the second reference voltage to the first comparator, and
the second lower-order analog-to-digital converter includes:
a fourth barrel shifter that supplies one of the first reference voltage and a third reference voltage to a second comparator included in the plurality of comparators.

8. The analog-to-digital converter according to claim 7, comprising:
a control circuit that instructs the fourth barrel shifter to supply the first reference voltage to the second comparator during the first period, and instructs the fourth barrel shifter to supply the third reference voltage to the second comparator during the second period.

9. The analog-to-digital converter according to claim 7, comprising:
a control circuit that controls a state of the first lower-order converter, the second lower-order converter and the calibrator,
wherein the control circuit controls the first lower-order converter, the second lower-order converter and the calibrator to enter one of:
a first state where, during the first period, the first reference voltage is supplied to the first comparator, the first comparator outputs a bit value of the first lower-order digital value corresponding to the first reference voltage, the first reference voltage is supplied to the second comparator, and the match/mismatch determination circuit outputs the first and second offset adjustment signals to the first and second comparators,
a second state where, during the first period, the second reference voltage is supplied to the first comparator, the first comparator outputs a bit value of the first lower-order digital value corresponding to the second reference voltage, the first reference voltage is supplied to the second comparator, and the match/mismatch determination circuit outputs the first and second offset adjustment signals to the first and second comparators, a third state where, during the first period, the first reference voltage is supplied to the first comparator, the first comparator outputs a bit value of the first lower-order digital value corresponding to the first reference voltage, the first reference voltage is supplied to the second comparator, and the match/mismatch determination circuit outputs the first and second offset adjustment signals to the first and second residual signal generators, and a fourth state where, during the second period, the first reference voltage is supplied to the first comparator, the first comparator outputs a bit value of the first lower-order digital value corresponding to the first reference voltage, the third reference voltage is supplied to the second comparator, and the match/mismatch determination circuit outputs the first and second offset adjustment signals to the first and second residual signal generators.

10. The analog-to-digital converter according to claim 4, wherein
the first lower-order analog-to-digital converter includes a plurality of comparators that include a calibration value holding unit that increases and decreases the conversion calibration value based on the first offset adjustment signal with respect to each value of the higher-order digital value, and calibrates an input offset voltage based on the conversion calibration value, and
the second lower-order analog-to-digital converter includes a plurality of comparators that include a calibration value holding unit that increases and decreases the conversion calibration value based on the second offset adjustment signal with respect to each value of the higher-order digital value output from the level shifter, and calibrates an input offset voltage based on the conversion calibration value.

11. The analog-to-digital converter according to claim 10, wherein
the first lower-order analog-to-digital converter includes:
a first barrel shifter that supplies one of a first reference voltage and a second reference voltage to a first comparator included in the plurality of comparators,
a second barrel shifter that switches between outputting an output of the first comparator as a bit value of the first lower-order digital value corresponding to the first reference voltage and outputting the output of the first comparator as a bit value of the first lower-order digital value corresponding to the second reference voltage, and
a third barrel shifter that supplies one of the first offset adjustment signal corresponding to the first reference voltage and the first offset adjustment signal corresponding to the second reference voltage to the first comparator, and
the second lower-order analog-to-digital converter includes:
a fourth barrel shifter that supplies one of the first reference voltage and a third reference voltage to a second comparator included in the plurality of comparators.

12. The analog-to-digital converter according to claim 11, comprising:
a control circuit that instructs the fourth barrel shifter to supply the first reference voltage to the second comparator during the first period, and instructs the fourth barrel shifter to supply the third reference voltage to the second comparator during the second period.

13. The analog-to-digital converter according to claim 11, comprising:
a control circuit that controls a state of the first lower-order converter and the second lower-order converter,
wherein the control circuit controls the first lower-order converter and the second lower-order converter to enter one of:
a first state where, during the first period, the first reference voltage is supplied to the first comparator, the first comparator outputs a bit value of the first lower-order digital value corresponding to the first reference voltage, the first reference voltage is supplied to the second comparator, and the match/mismatch determination circuit outputs the first and second offset adjustment signals to the first and second comparators,
a second state where, during the first period, the second reference voltage is supplied to the first comparator, the first comparator outputs a bit value of the first lower-order digital value corresponding to the second reference voltage, the first reference voltage is supplied to the second comparator, and the match/mismatch determination circuit outputs the first and second offset adjustment signals to the first and second comparators, and
a third state where, during the second period, the first reference voltage is supplied to the first comparator, the first comparator outputs a bit value of the first lower-order digital value corresponding to the first reference voltage, the third reference voltage is supplied to the second comparator, and the match/mismatch determination circuit outputs the first and second offset adjustment signals to the first and second comparators.

14. The analog-to-digital converter according to claim 7, wherein a voltage difference between the first reference voltage and the third reference voltage is determined by a shift amount of the higher-order digital value during the second period.

15. The analog-to-digital converter according to claim 9, wherein a voltage difference between the first reference voltage and the third reference voltage is determined by a shift amount of the higher-order digital value during the second period.

16. The analog-to-digital converter according to claim 12, wherein a voltage difference between the first reference voltage and the third reference voltage is determined by a shift amount of the higher-order digital value during the second period.

17. The analog-to-digital converter according to claim 13, wherein a voltage difference between the first reference voltage and the third reference voltage is determined by a shift amount of the higher-order digital value during the second period.

* * * * *